US011837640B2

(12) United States Patent
Togo et al.

(10) Patent No.: US 11,837,640 B2
(45) Date of Patent: Dec. 5, 2023

(54) TRANSISTORS WITH STEPPED CONTACT VIA STRUCTURES AND METHODS OF FORMING THE SAME

(71) Applicant: SANDISK TECHNOLOGIES LLC, Addison, TX (US)

(72) Inventors: Mitsuhiro Togo, Yokkaichi (JP); Hiroshi Nakatsuji, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 148 days.

(21) Appl. No.: 17/362,121

(22) Filed: Jun. 29, 2021

(65) Prior Publication Data

US 2022/0416037 A1    Dec. 29, 2022

(51) Int. Cl.
| | |
|---|---|
| *H01L 29/417* | (2006.01) |
| *H01L 29/40* | (2006.01) |
| *H01L 23/528* | (2006.01) |
| *H01L 21/768* | (2006.01) |
| *H01L 29/78* | (2006.01) |

(52) U.S. Cl.
CPC .. *H01L 29/41775* (2013.01); *H01L 21/76816* (2013.01); *H01L 23/5283* (2013.01); *H01L 29/401* (2013.01); *H01L 29/7833* (2013.01)

(58) Field of Classification Search
CPC ........... H01L 29/41775; H01L 23/5283; H01L 21/76816; H01L 29/7833
See application file for complete search history.

(56) References Cited

U.S. PATENT DOCUMENTS

| | | | |
|---|---|---|---|
| 6,156,636 A | * | 12/2000 | Yeom ................ H01L 21/76897 |
| | | | 257/E21.507 |
| 9,859,422 B2 | | 1/2018 | Nishikawa et al. |
| 10,115,735 B2 | | 10/2018 | Amano et al. |
| 10,224,407 B2 | | 3/2019 | Chowdhury et al. |
| 10,256,099 B1 | | 4/2019 | Akaiwa et al. |
| 10,355,017 B1 | * | 7/2019 | Nakatsuji ............... H10B 43/50 |
| 10,355,100 B1 | | 7/2019 | Ueda et al. |
| 10,770,459 B2 | | 9/2020 | Iwata et al. |
| 10,910,020 B1 | | 2/2021 | Kodate et al. |
| 11,004,974 B1 | | 5/2021 | Takimoto |
| 11,616,128 B2 | * | 3/2023 | Lu ......................... H01L 29/785 |
| | | | 257/344 |

(Continued)

OTHER PUBLICATIONS

U.S. Appl. No. 16/809,798, filed Mar. 5, 2020, SanDisk Technologies LLC.

(Continued)

*Primary Examiner* — Joseph C. Nicely
(74) *Attorney, Agent, or Firm* — THE MARBURY LAW GROUP PLLC

(57) ABSTRACT

A transistor includes a semiconductor substrate including a first active region, a second active region, and a semiconductor channel, a gate stack structure that overlies the semiconductor channel, a proximal dielectric material layer overlying the semiconductor substrate, laterally surrounding the gate stack structure, a distal dielectric material layer overlying the proximal dielectric material layer, and a first contact via structure contacting the first active region having a greater lateral extent at a level of the proximal dielectric material layer than at a level of the distal dielectric material layer.

2 Claims, 18 Drawing Sheets

(56) References Cited

U.S. PATENT DOCUMENTS

| | | | |
|---|---|---|---|
| 2003/0162353 A1* | 8/2003 | Park | H10B 12/0335 257/E27.088 |
| 2007/0221970 A1* | 9/2007 | Kadoshima | H01L 21/823842 257/288 |
| 2008/0128825 A1* | 6/2008 | Sato | H01L 29/66545 257/E21.632 |
| 2009/0145877 A1* | 6/2009 | Chang | H01L 21/31144 216/13 |
| 2009/0321837 A1* | 12/2009 | Wei | H01L 21/823807 257/E21.585 |
| 2011/0042752 A1* | 2/2011 | Mayuzumi | H01L 21/2855 257/E21.409 |
| 2013/0171764 A1* | 7/2013 | Sano | H01L 27/14638 438/73 |
| 2015/0263168 A1* | 9/2015 | Hsiao | H01L 29/66545 438/301 |
| 2016/0351709 A1 | 12/2016 | Nishikawa et al. | |
| 2017/0221756 A1* | 8/2017 | Tsutsumi | H10B 43/27 |
| 2018/0247954 A1 | 8/2018 | Amano et al. | |
| 2018/0248013 A1* | 8/2018 | Chowdhury | H01L 29/7833 |
| 2018/0331118 A1 | 11/2018 | Amano | |
| 2019/0296012 A1 | 9/2019 | Iwata et al. | |
| 2020/0328154 A1* | 10/2020 | Jiang | H01L 21/76816 |
| 2022/0109071 A1* | 4/2022 | Togo | H01L 29/66659 |

OTHER PUBLICATIONS

U.S. Appl. No. 16/901,091, filed Jun. 15, 2020, SanDisk Technologies LLC.
U.S. Appl. No. 17/007,761, filed Aug. 28, 2020, SanDisk Technologies LLC.
U.S. Appl. No. 17/007,823, filed Aug. 31, 2020, SanDisk Technologies LLC.
U.S. Appl. No. 17/063,084, filed Oct. 5, 2020, SanDisk Technologies LLC.
U.S. Appl. No. 17/063,145, filed Oct. 5, 2020, SanDisk Technologies LLC.
U.S. Appl. No. 17/063,182, filed Mar. 1, 2021, SanDisk Technologies LLC.
U.S. Appl. No. 17/188,271, filed Mar. 1, 2021, SanDisk Technologies LLC.
U.S. Appl. No. 17/316,015, filed May 10, 2021, SanDisk Technologies LLC.
U.S. Appl. No. 17/316,079, filed May 10, 2021, SanDisk Technologies LLC.
U.S. Appl. No. 17/348,305, filed Jun. 15, 2021, SanDisk Technologies LLC.
U.S. Appl. No. 17/348,328, filed Jun. 15, 2021, SanDisk Technologies LLC.

* cited by examiner

TRANSISTORS WITH STEPPED CONTACT VIA STRUCTURES AND METHODS OF FORMING THE SAME

FIELD

The present disclosure generally relates to semiconductor devices, and particularly to transistors including stepped contact via structures for high-density contacts, and methods of manufacturing the same.

BACKGROUND

As dimensions for semiconductor devices shrink, contact via structures for field effect transistors face scaling issues in which the contact area for the contact via structures decreases and increase the contact resistance. For example, source contact via structures and drain contact via structures contact top surfaces of source regions and drain regions. As the lateral dimensions of the source regions and the drain regions decrease, the area of each of the source regions and the drain region decreases.

SUMMARY

According to an aspect of the present disclosure, a transistor is provided, which comprises: a semiconductor substrate including a first active region, a second active region, and a semiconductor channel of a first conductivity type located between the first active region and the second active region, wherein the first active region and the second active region have a doping of a second conductivity type that is opposite of the first conductivity type; a gate stack structure that overlies the semiconductor channel and comprises a gate dielectric and a gate electrode; a proximal dielectric material layer overlying the semiconductor substrate and laterally surrounding the gate stack structure; a distal dielectric material layer overlying the proximal dielectric material layer; and a first contact via structure vertically extending through the distal dielectric material layer and the proximal dielectric material layer, contacting a top surface of the first active region, and having an upper sidewall contacting the distal dielectric material layer, a lower sidewall contacting the proximal dielectric material layer, and a horizontal connecting surface that connects a bottom edge of the upper sidewall to a top edge of the lower sidewall.

According to another aspect of the present disclosure, a method of forming a transistor is provided, which comprises: forming a gate stack structure comprising a gate dielectric and a gate electrode over a semiconductor substrate including a semiconductor material layer having a doping of a first conductivity type; forming a first active region and a second active region having a doping of a second conductivity type that is opposite of the first conductivity type in the semiconductor material layer, wherein the first active region and the second active region are laterally spaced apart by a semiconductor channel that underlies the gate stack structure; forming a proximal dielectric material layer comprising a first dielectric material over the semiconductor substrate and around the gate stack structure; forming a distal dielectric material layer comprising a second dielectric material over the proximal dielectric material layer; forming a first contact via cavity through the distal dielectric material layer and the proximal dielectric material layer over the first active region; laterally expanding a lower portion of the first contact via cavity by etching the first dielectric material around the first contact via cavity selective to the second dielectric material; and forming a first contact via structure in the first contact via cavity on a top surface of the first active region.

DETAILED DESCRIPTION

Figure 1:
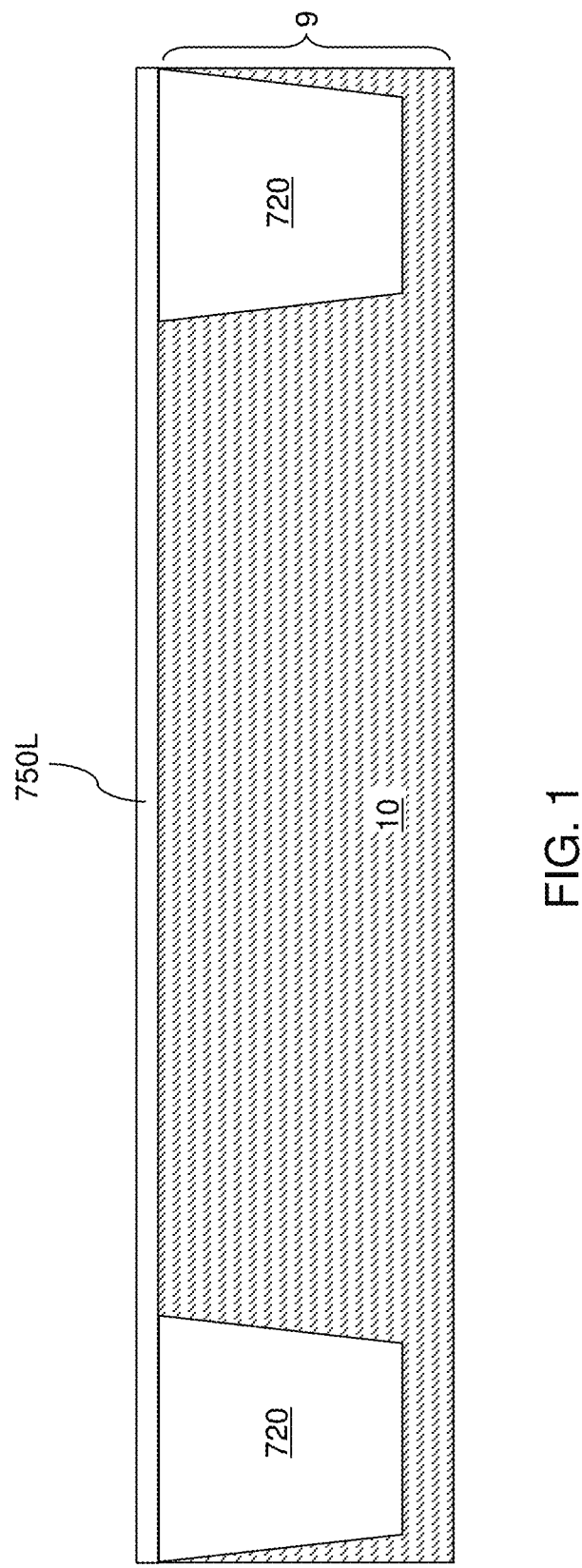
FIG. 1 is a vertical cross-sectional view of a first exemplary structure after formation of a gate dielectric layer according to a first embodiment of the present disclosure.

Embodiments of the present disclosure are directed to including stepped transistor contact via structures, and methods of manufacturing the same. Specifically, embodiments of the present disclosure are directed to contact via structures vertically extending through a stack of a proximal dielectric material layer and a distal dielectric material layer overlying active regions of a field effect transistor. The contact via structures can have a greater lateral extent at a level of the proximal dielectric material layer to provide low contact resistance to the active regions. Contact via cavities can be selectively expanded at the level of the proximal dielectric material layer to increase the contact area to the active regions. An isotropic etch process employed to expand the lower portions of the contact via cavities can be selective to a dielectric liner to ensure that electrical shorts are avoided. The various aspects of the present disclosure are discussed in detail herebelow with reference to accompanying drawings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Referring to FIG. 1, a first exemplary structure according to a first embodiment of the present disclosure is provided. The exemplary structure includes a semiconductor substrate 9, which may be, for example, a semiconductor wafer such as a commercially available silicon wafer. Generally, the semiconductor substrate 9 includes a substrate semiconductor layer 10 which is a semiconductor material layer containing, and/or consisting essentially of, a semiconductor material. The semiconductor material may be at least one elemental semiconductor material (e.g., single crystal silicon), at least one III-V compound semiconductor material, or at least one II-VI compound semiconductor material. Various portions of the substrate semiconductor layer 10 may be doped with p-type dopants or n-type dopants at suitable atomic concentrations. The substrate semiconductor layer 10 can be a top portion of the bulk semiconductor substrate (e.g., a doped well in a silicon wafer). Alternatively, the substrate semiconductor layer 10 may comprise a semiconductor layer formed on a top surface of an insulating, semiconductor or conductive substrate, such as a silicon-on-insulator type substrate.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The substrate semiconductor layer 10 can include a single crystalline semiconductor material such as single crystalline silicon. The illustrated portion of the substrate semiconductor layer 10 can have a doping of a first conductively type, which may be p-type or n-type. The atomic concentration of first conductivity type dopants in the substrate semiconductor layer 10 can be in a range from $1.0 \times 10^{14}/cm^3$ to $1.0 \times 10^{17}/cm^3$, although lesser and greater atomic concentrations can also be employed.

Shallow trench isolation structures 720 can be formed in upper portions of the substrate semiconductor layer 10 to provide electrical isolation between neighboring devices. For example, shallow trenches can be formed around each device region that requires electrical isolation from neighboring device regions, and can be filled with a dielectric material such as silicon oxide. Excess portions of the dielectric material can be removed from above the top surface of the substrate semiconductor layer 10 by a planarization process such as chemical mechanical planarization. Remaining portions of the dielectric material in the shallow trenches constitute the shallow trench isolation structures 720. In one embodiment, one of the shallow trench isolation structures 720 can laterally surround a device region such as the device region illustrated in FIG. 1. In one embodiment, an inner periphery of the shallow trench isolation structure 720 that laterally surrounds a device region can have a rectangular shape in a plan view, i.e., a view along a direction perpendicular to the top surface of the substrate semiconductor layer 10. The length of the rectangular shape can be the lateral dimension of a field effect transistor along a channel direction (i.e., a direction along which electrical current flows), and the width of the rectangular shape can be the width of the field effect transistor perpendicular to the channel direction (i.e., a direction along which the gate electrode of the field effect transistor laterally extends).

A gate dielectric layer 750L can be formed on the top surface of the substrate semiconductor layer 10. The gate dielectric layer 750L can include any gate dielectric material known in the art. For example, the gate dielectric layer 750L can include a semiconductor oxide layer (such as a silicon oxide layer) formed by thermal oxidation of a surface portion of the substrate semiconductor layer 10 and/or deposition of semiconductor oxide material (such as silicon oxide by thermal decomposition of tetraethylorthosilicate (TEOS)). Alternatively or additionally, the gate dielectric layer 750L can include a dielectric metal oxide layer. Exemplary materials that may be employed for the dielectric metal oxide layer within the gate dielectric layer 750L include, but are not limited to, aluminum oxide, hafnium oxide, zirconium oxide, tantalum oxide, titanium oxide, and lanthanum oxide. The dielectric metal oxide layer may be deposited by atomic layer deposition or chemical vapor deposition. The thickness of the gate dielectric layer 750L can be in a range from 1 nm to 12 nm, such as from 1.5 nm to 6 nm, although lesser and greater thicknesses can also be employed.

Figure 2:
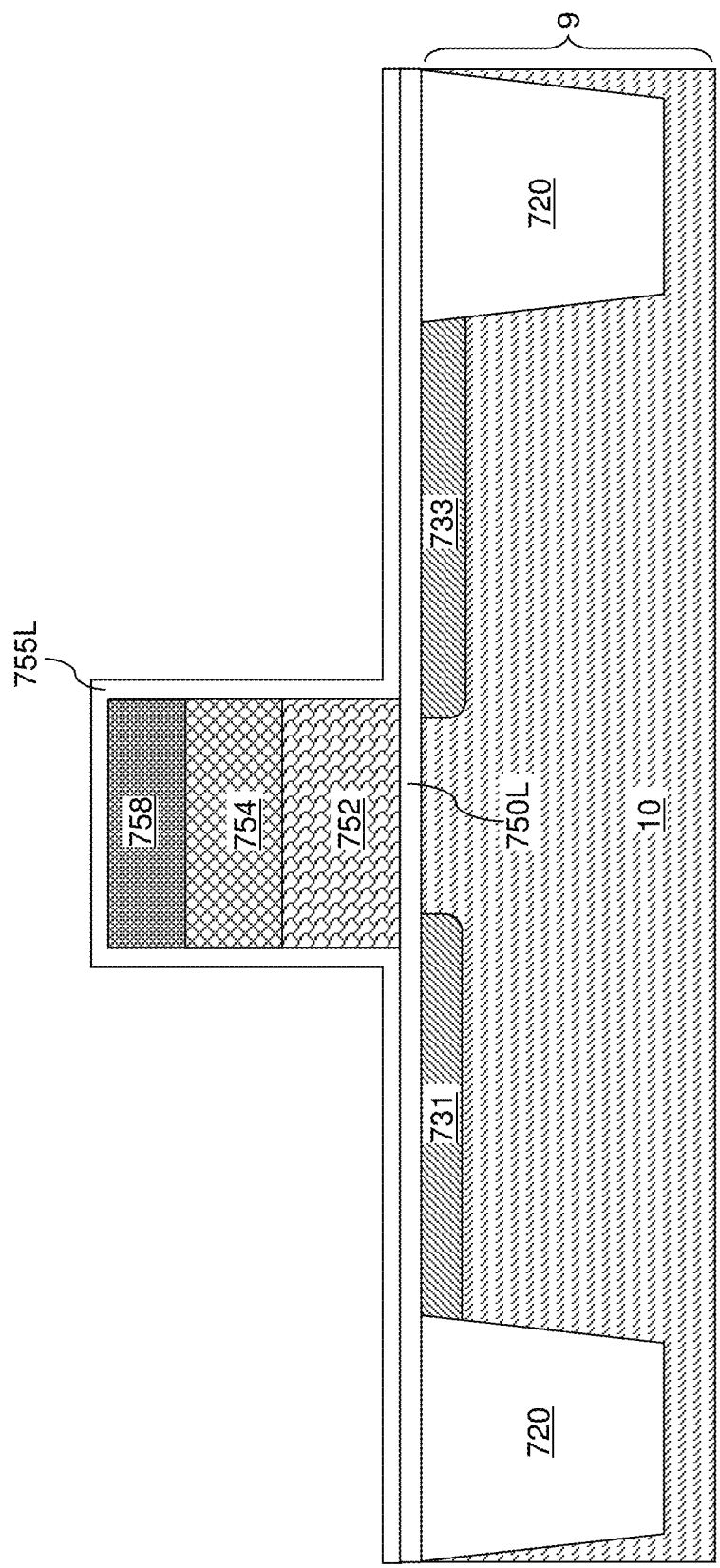
FIG. 2 is a vertical cross-sectional view of the first exemplary structure after formation of a stack of a gate dielectric, a gate electrode, a gate cap dielectric, doped extension regions, and a dielectric gate liner layer according to the first embodiment of the present disclosure.

Referring to FIG. 2, at least one gate material layer and an optional gate cap dielectric layer can be deposited over the gate dielectric layer 750L. The at least one gate material layer includes at least one of a semiconductor gate material layer and a metallic gate material layer. The semiconductor gate material layer includes a doped semiconductor material such as doped polysilicon. The semiconductor gate material layer can be deposited by chemical vapor deposition. Dopants can be introduced in the semiconductor gate material layer by in-situ doping or by ion implantation. The thickness of the semiconductor gate material layer can be in a range from 20 nm to 200 nm, although lesser and greater thicknesses can also be employed. The metallic gate material layer includes a metallic gate material such as TiN, TaN, WN, Zr, Al, Ta, Ti, Mo, Sr, V, Sn, W, Er, Ru, Co, Pb, Ni, Re, Ir, Pt, any other metal, an intermetallic alloy, a metal silicide material, or a layer stack thereof. The metallic gate material layer can be deposited by physical vapor deposition (sputtering) and/or by chemical vapor deposition. The thickness of the metallic gate material layer can be in a range from 20 nm to 200 nm, although lesser and greater thicknesses can also be employed. The total thickness of the at least one gate material layer can be in a range from 50 nm to 300 nm, although lesser and greater thicknesses can also be employed.

The gate cap dielectric layer includes a dielectric material such as silicon nitride. The gate cap dielectric layer can be deposited by chemical vapor deposition. The thickness of the gate cap dielectric layer can be in a range from 10 nm to 50 nm, although lesser and greater thicknesses can also be employed.

A photoresist layer (not shown) can be applied over the stack of the gate dielectric layer 750L, the at least one gate material layer, and the gate cap dielectric layer, and can be lithographically patterned to cover areas in which gate electrodes are to be subsequently formed. An anisotropic etch process can be performed to etch portions of the at least one gate material layer and the gate cap dielectric layer that are not masked by the photoresist layer. The anisotropic etch process sequentially etches the materials of the gate cap dielectric layer and the at least one gate material layer. In one embodiment, a termination portion of the anisotropic etch process can be selective to the material of the gate dielectric layer 750L, and the gate dielectric layer 750L may remain outside the areas that are masked by the photoresist layer. Alternatively, unmasked portions of the gate dielectric layer 750L may be removed by the anisotropic etch process or a subsequent isotropic etch process that etches the material(s) of the gate dielectric layer 750L selective to the material of the substrate semiconductor layer 10.

Patterned portions of the gate cap dielectric layer comprise gate cap dielectrics 758, and patterned portions of the at least one gate material layer comprise gate electrodes (752, 754). If the at least one gate material layer includes a vertical stack of a semiconductor gate material layer and a metallic gate material layer, each gate electrode (752, 754) can include a vertical stack of a semiconductor gate electrode portion 752 and a metallic gate electrode portion 754. Each semiconductor gate electrode portion 752 is a patterned portion of the semiconductor gate material layer, and each metallic gate electrode portion 754 is a patterned portion of the metallic gate material layer.

Doped extension regions (731, 733) having a doping of a second conductivity type can be formed within surface regions of the substrate semiconductor layer 10 by implantation of dopants of the second conductivity type. The second conductivity type is the opposite of the first conductivity type. For example, if the first conductivity type is p-type, the second conductivity type is n-type, and vice versa. The doped extension regions (731, 733) can include a source-side doped extension region 731 (which is also called a source extension region) that is formed on a source side, and a drain-side doped extension region 733 (which is also called a drain extension region) that is formed on a drain side which is the opposite side of the source side with respective to the illustrated gate electrode (752, 754). The energy of the ion implantation process that implants the dopants of the second conductivity type can be selected such that p-n junctions formed between the doped extension regions (731, 733) and the substrate semiconductor layer 10 has a depth in a range from 3 nm to 60 nm, such as from 6 nm to 30 nm, although lesser and greater depths can also be employed. The dose of dopants of the second conductivity type can be selected such that the average atomic concentration of dopants of the second conductivity type in the doped extension regions (731, 733) is in a range from $1.0 \times 10^{18}/cm^3$ to $1.0 \times 10^{21}/cm^3$, although lesser and greater atomic concentrations can also be employed. The doped extension regions (731, 733) can be formed within surface portions of the substrate semiconductor layer 10 that are not masked by the gate electrode (752, 754), and may have an areal overlap with peripheral portions of gate electrode (752, 754). The photoresist layer can be subsequently removed, for example, by ashing.

A dielectric gate liner layer 755L including a first dielectric material such as silicon oxide can be optionally deposited by a conformal deposition process. The dielectric gate liner layer 755L can have a thickness in a range from 2 nm to 10 nm, although lesser and greater thicknesses can also be employed.

Figure 3:
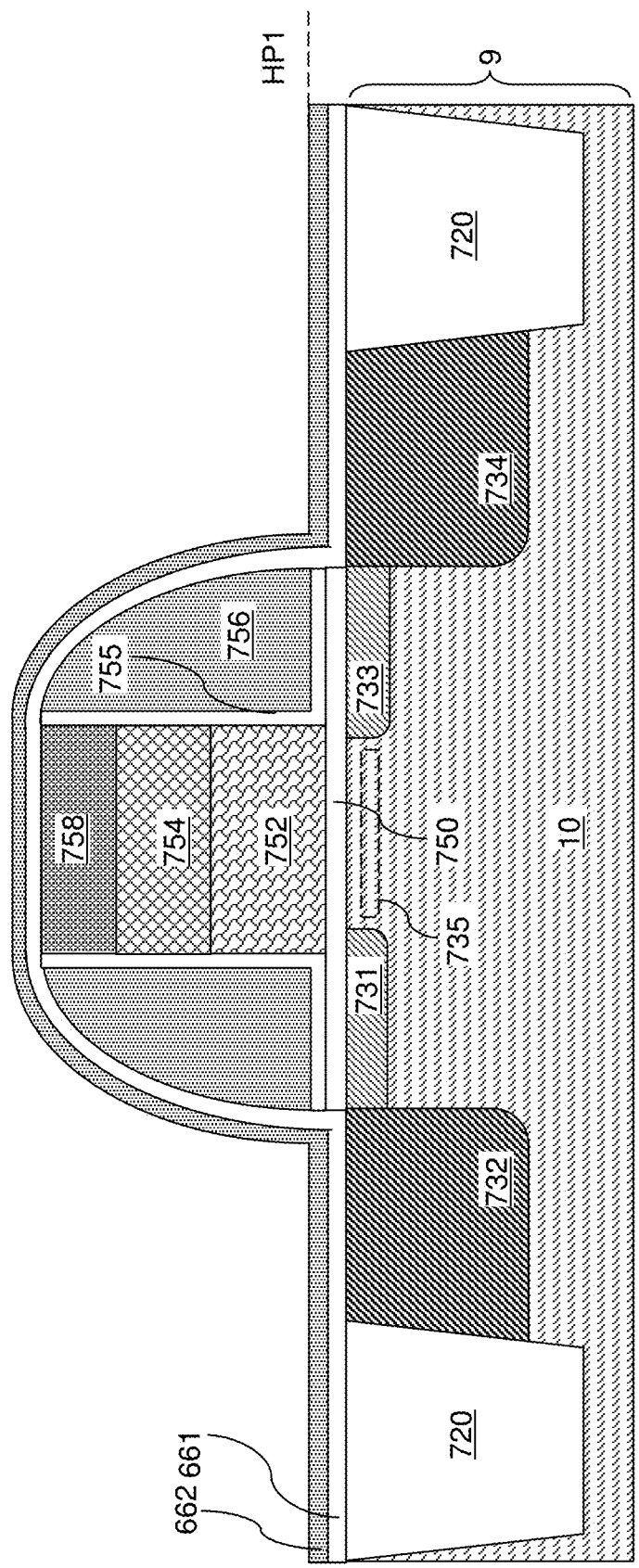
FIG. 3 is a vertical cross-sectional view of the first exemplary structure after formation of dielectric gate spacers, deep active regions, and at least one dielectric liner according to the first embodiment of the present disclosure.

Referring to FIG. 3, a continuous gate spacer dielectric layer including a second dielectric material such as silicon nitride can be subsequently deposited over the dielectric gate liner layer 755L. The thickness of vertical portions of the continuous gate spacer dielectric layer can be in a range from 5 nm to 100 nm, such as from 8 nm to 30 nm, although lesser and greater thicknesses can also be employed.

An anisotropic sidewall spacer etch process can be performed to remove horizontal portions of the continuous gate spacer dielectric layer and the dielectric gate liner layer 755L. A remaining portion of the continuous gate spacer dielectric layer includes a dielectric gate spacer 756 that laterally surrounds the gate electrode (752, 754). A remaining portion of the conformal dielectric gate liner layer 755L includes a dielectric gate liner 755, which may have an "L-shaped" vertical cross-sectional profile. Portions of the gate dielectric layer 750L that are not covered by a contiguous combination of the gate cap dielectric 758, the dielectric gate liner 755, and the dielectric gate spacer 756 can be removed by a terminal portion of the anisotropic etch process. The anisotropic etch process can stop on the top surface of the substrate semiconductor layer 10. A remaining portion of the gate dielectric layer 750L comprises a gate dielectric 750. A contiguous combination of the gate dielectric 750, the gate electrode (752, 754), the optional gate cap dielectric 758, the optional dielectric gate liner 755, and the dielectric gate spacer 756 constitutes a gate stack structure (750, 752, 754, 758, 755, 756). Generally, the gate stack structure (750, 752, 754, 758, 755, 756) can be formed over the substrate semiconductor layer 10.

Deep active regions (732, 734) having a doping of the second conductivity type can be formed within surface regions of the substrate semiconductor layer 10 by additional implantation of dopants of the second conductivity type. The gate stack structure (750, 752, 754, 758, 755, 756) is employed as a self-aligned ion implantation mask. The deep active regions (732, 734) can include a deep source region 732 that incorporates a portion of the source-side doped extension region 731, and a deep drain region 734 that incorporates a portion of the drain-side doped extension region 733. The energy of the ion implantation process that implants the dopants of the second conductivity type can be selected such that the p-n junctions formed between the deep active regions (732, 734) and the substrate semiconductor layer 10 has a depth in a range from 30 nm to 300 nm, such as from 60 nm to 150 nm, although lesser and greater depths can also be employed. The dose of dopants of the second conductivity type can be selected such that the average atomic concentration of dopants of the second conductivity type in the deep active regions (732, 734) is in a range from $1.0 \times 10^{19}/cm^3$ to $2.0 \times 10^{21}/cm^3$, although lesser and greater atomic concentrations can also be employed. The average dopant concentration of the dopants of the second conductivity in the deep active regions (732, 734) can be higher than the average dopant concentration of the dopants of the second conductivity in the doped extension regions (731, 733). Remaining portions of the doped extension regions (731,733) underlie the optional dielectric gate liner 755 and the dielectric gate spacer 756.

Each contiguous combination of a source-side doped extension region 731 and deep source region 732 constitutes a source region (731, 732). Each contiguous combination of a drain-side doped extension region 733 and deep drain region 734 constitutes a drain region (733, 733). A surface portion of the substrate semiconductor layer 10 located between the source-side doped extension region 731 and the drain-side doped extension region 733 constitutes a semiconductor channel 735. The gate stack structure (750, 752, 754, 758, 755, 756) overlies the semiconductor channel 735. The dielectric gate spacer 756 laterally surrounds the gate electrode (752, 754) and the gate cap dielectric 758.

The source region (731, 732) and the drain region (733, 734) are collectively referred to as active regions {(731, 732), (733, 734)}. The source region (731, 732) is also referred to as a first active region, and the drain region (733, 734) is also referred to as a second active region. Generally, the substrate semiconductor layer 10 has a doping of the first conductivity type, and embedding a first active region (731, 732) and a second active region (733, 734) having a doping of a second conductivity type that is an opposite of the first conductivity type. The first exemplary structure includes a field effect transistor.

Generally, the first active region (731, 732) and the second active region (733, 734) have a doping of the second conductivity type that is opposite of the first conductivity type, and is formed within the substrate semiconductor layer 10. The first active region (731, 732) and the second active region (733, 734) can be laterally spaced apart by the semiconductor channel 735 that underlie the gate stack structure (750, 752, 754, 758, 755, 756).

At least one dielectric liner (661, 662) may be deposited over the gate stack structure (750, 752, 754, 758, 755, 756) and the substrate semiconductor layer 10. In one embodiment, the at least one dielectric liner (661, 662) can include a silicon oxide liner 661 and a silicon nitride liner 662. In one embodiment, the silicon oxide liner 661 can be deposited on, and over, the field effect transistor, and the silicon nitride liner 662 can be subsequently deposited on the silicon oxide liner 661. The silicon oxide liner 661 includes silicon oxide and can be formed by a conformal deposition process. For example, the silicon oxide liner 661 can be formed by decomposition of a silicon oxide precursor such as tetraethylorthosilicate (TEOS) in a low pressure chemical vapor deposition (LPCVD) process. The thickness of the silicon oxide liner 661 can be in a range from 1 nm to 10 nm, although lesser and greater thicknesses can also be employed. The silicon oxide liner 661 promotes adhesion of a silicon nitride liner to be subsequently formed.

The silicon nitride liner 662 can be deposited on the top surface of the silicon oxide liner 661. The silicon nitride liner 662 can be deposited by plasma enhanced chemical vapor deposition, which induces incorporation of hydrogen into the silicon nitride liner 662. The thickness of the horizontal portions of the silicon nitride liner 662 can be in a range from 10 nm to 100 nm, such as from 20 nm to 50 nm, although lesser and greater thicknesses can also be employed. While an embodiment in which the at least one dielectric liner (661, 662) comprises the silicon oxide liner 661 and the silicon nitride liner 662 is described above, embodiments are expressly contemplated herein in which no dielectric liners are present, only one dielectric liner is present, or three or more dielectric liners are present. In one embodiment, the silicon nitride liner 662 may be replaced with a dielectric metal oxide liner such as an aluminum oxide liner, a titanium oxide liner, a tantalum oxide liner, a yttrium oxide liner, or a lanthanum oxide liner. Generally, at least one dielectric liner (661, 662) including a respective dielectric material can be formed. At least one of the at least one dielectric liner (661, 662) includes a dielectric material that can function as an etch stop dielectric material, such as silicon nitride or a dielectric metal oxide. The at least one dielectric liner (661, 662) is formed over and contacts the top surface of the semiconductor substrate 9. The at least one dielectric liner (661, 662) is also formed over and contacts the gate cap dielectric 758 and the dielectric gate spacer 756. A topmost surface of the horizontally-extending portion of the at least one dielectric liner (661, 662) can be located entirely within a first horizontal plane HP1.

Figure 4:
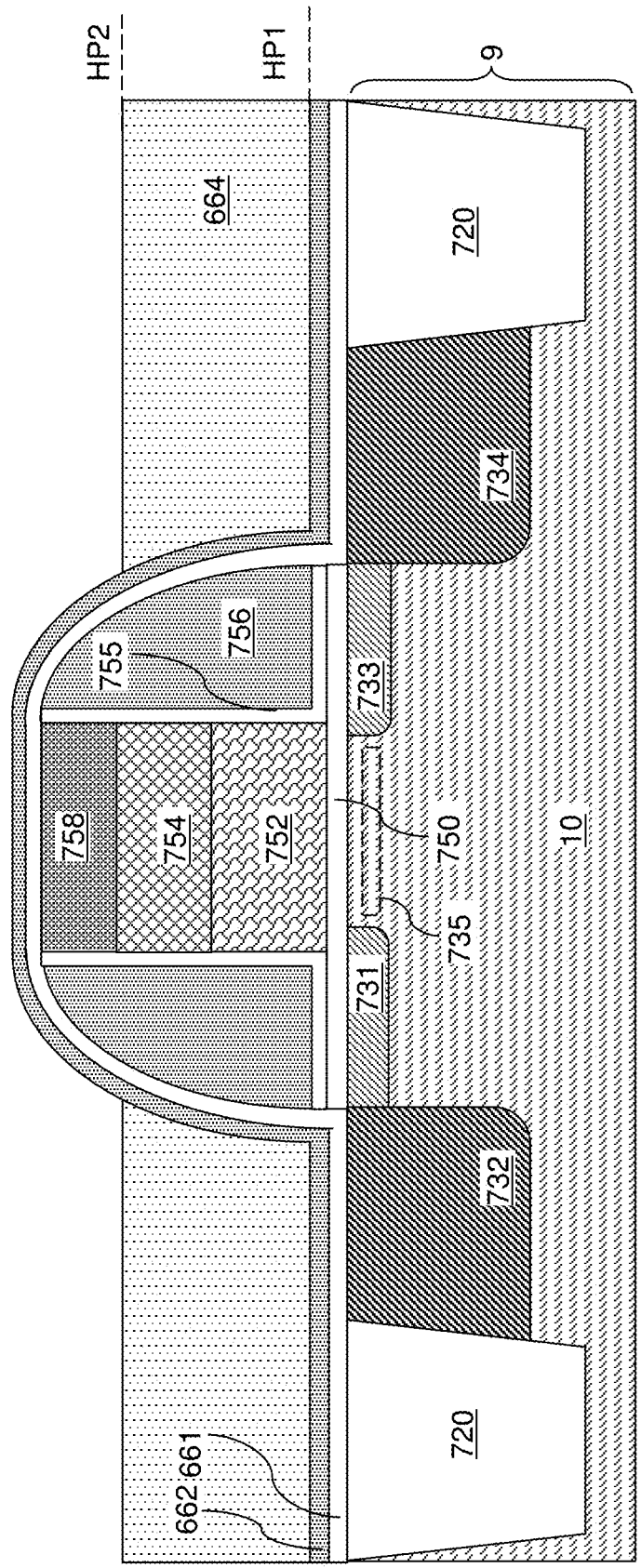
FIG. 4 is a vertical cross-sectional view of the first exemplary structure after formation of a proximal dielectric material layer according to the first embodiment of the present disclosure.

Referring to FIG. 4, a proximal dielectric material layer 664 comprising a first dielectric material can be formed over the semiconductor substrate 9 and around the gate stack structure (750, 752, 754, 758, 755, 756). The first dielectric material is selected such that the first dielectric material can be subsequently etched selective to the material of one of the at least one dielectric liner (661, 662) (such as the silicon nitride liner 662) at a higher etch rate than a second dielectric material to be employed to form a distal dielectric material layer in a subsequent processing step. In one embodiment, the first dielectric material of the proximal dielectric material layer 664 may comprise borosilicate glass, fluorosilicate glass, borophosphosilicate glass, porous or nonporous organosilicate glass, or a low-k spin-on polymer material (such as SiLK™ from The Dow Chemical Company™).

According to an embodiment of the present disclosure, the proximal dielectric material layer 664 may be formed to provide a top surface that is more proximal to the semiconductor substrate 9 than a top surface of the gate stack structure (750, 752, 754, 758, 755, 756) is to the semiconductor substrate 9. The top surface of the gate stack structure (750, 752, 754, 758, 755, 756) can be the top surface of the gate cap dielectric 758, or can be the top surface of the gate electrode (752, 754) in case a gate cap dielectric 758 is omitted. In one embodiment, the proximal dielectric material layer 664 may be formed by a self-planarizing deposition process such as spin coating. In this case, the process parameters of the self-planarizing deposition process (such as the applied amount of the first dielectric material and/or the rotation speed of the semiconductor substrate 9) may be selected such that a planar top surface of the proximal dielectric material layer 664 is formed within a second horizontal plane HP2 that is located above the first horizontal plane HP1 and is located below a horizontal plane including a topmost surface of the gate stack structure (750, 752, 754, 758, 755, 756), such as top surface of the gate cap dielectric 758. In one embodiment, the thickness of the proximal dielectric material layer 664 may be in a range from 10% to 90%, such as from 20% to 80% and/or from 30% to 70%, of the vertical distance between the first horizontal plane HP1 and the horizontal plane including the topmost surface of the gate stack structure (750, 752, 754, 758, 755, 756). In one embodiment, the thickness of the proximal dielectric material layer 664 may be in a range from 15 nm to 400 nm, such as from 30 nm to 300 nm, although lesser and greater thicknesses may also be employed.

In an alternative embodiment, the proximal dielectric material layer 664 may be deposited employing a non-self-planarizing deposition process such as a chemical vapor deposition process. The top surface of the deposited first dielectric material can be planarized by performing a planarization process such as a chemical mechanical polishing (CMP) process. In this case, the horizontal top surface of the planarized first dielectric material can be formed within, or above, the horizontal plane including the topmost surface of the gate stack structure (750, 752, 754, 758, 755, 756). Subsequently, an upper portion of the planarized first dielectric material can be recessed by a recess process such that the top surface of the recessed first dielectric material is formed at the second horizontal plane HP2. The recess process can etch the first dielectric material selective to the material of the at least one dielectric liner (661, 662) (for example, selective to the material of the silicon nitride liner 662). The recess etch process may comprise an isotropic etch process such as a wet etch process or a chemical dry etch process, or may comprise an anisotropic etch process such as a reactive ion etch process. Generally, the proximal dielectric material layer 664 overlies the semiconductor substrate 9, laterally surrounds the gate stack structure (750, 752, 754, 758, 755, 756), and has a top surface within the second horizontal plane HP2, which is more proximal to the semiconductor substrate 9 than a top surface of the gate stack structure (750, 752, 754, 758, 755, 756) is to the semiconductor substrate 9.

In one embodiment, the proximal dielectric material layer 664 can comprise, and/or can consist essentially of, undoped silicate glass formed by decomposition of tetraethylorthosilicate (TEOS). In this case, the proximal dielectric material layer 664 can include hydrogen atoms at an atomic concentration greater than 3 part per million (p.p.m.) and carbon atoms at an atomic concentration greater than 1 part per million, which may be caused by incorporation of impurities during decomposition of TEOS or by incorporation of a residual solvent material during application of a spin-on-glass material. For example, the proximal dielectric material layer 664 can include hydrogen atoms at an atomic concentration in a range from 3 p.p.m. to 1,000 p.p.m., and can include carbon atoms at an atomic concentration in a range from 1 p.p.m. to 300 p.p.m.

Figure 5:
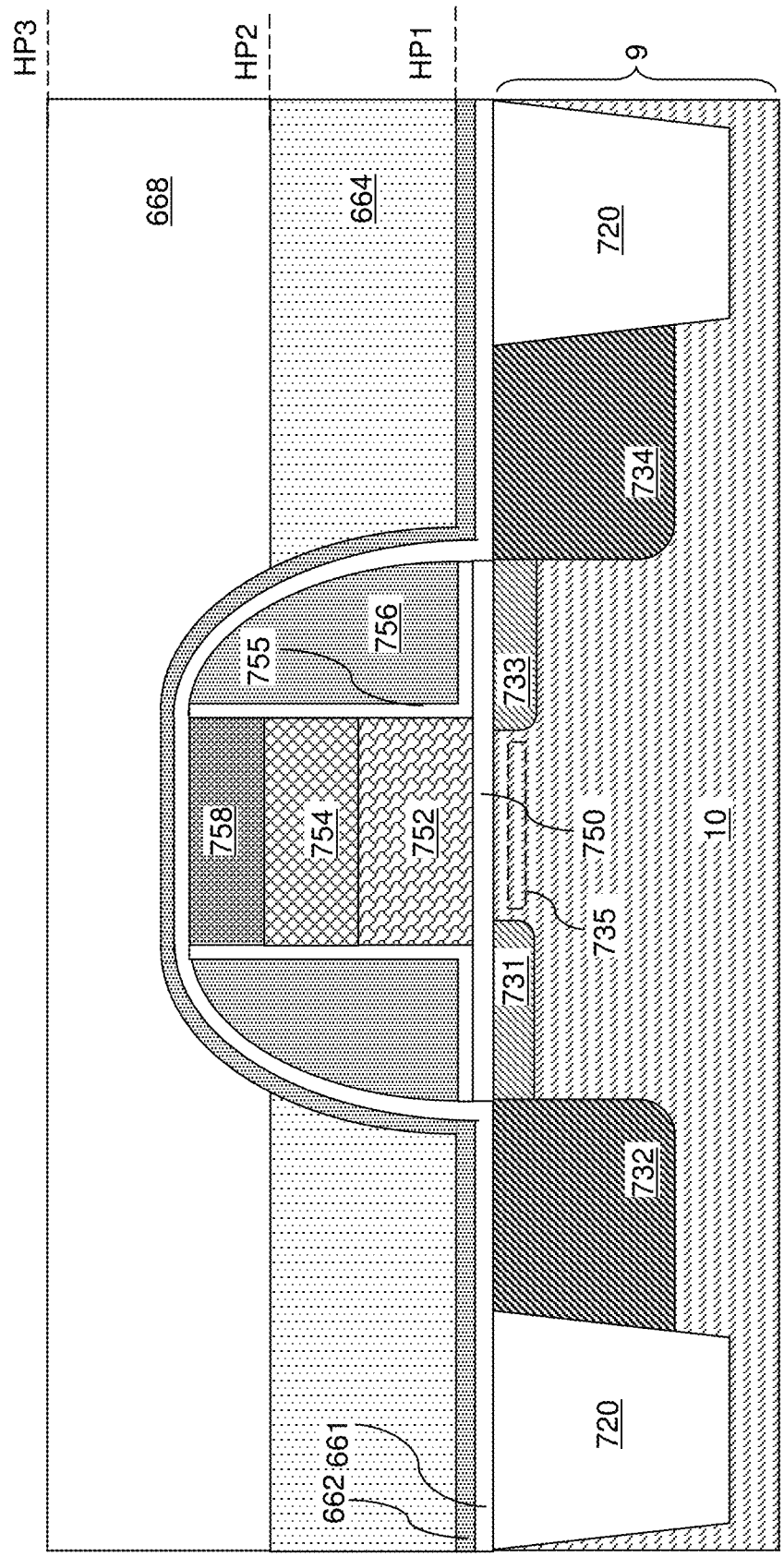
FIG. 5 is a vertical cross-sectional view of the first exemplary structure after formation of a distal dielectric material layer according to the first embodiment of the present disclosure.

Referring to FIG. 5, a distal dielectric material layer 668 comprising a second dielectric material can be formed over the proximal dielectric material layer 664. In one embodiment, the distal dielectric material layer 668 may be formed directly on the top surface of the proximal dielectric material layer 664. The second dielectric material of the distal dielectric material layer 668 differs from the first dielectric material of the proximal dielectric material layer 664, and provide a higher etch resistance to an etch process to be subsequently employed to etch the first dielectric material than the first dielectric material. In one embodiment, the first dielectric material of the proximal dielectric material layer 664 may comprise borosilicate glass, fluorosilicate glass, borophosphosilicate glass, porous or nonporous organosilicate glass, or a low-k spin-on polymer material, and the second dielectric material of the distal dielectric material layer 668 comprises undoped silicate glass, nitrogen-doped organosilicate glass, silicon carbide nitride, or another low-k spin-on polymer material having a greater etch resistance than the first dielectric material of the proximal dielectric material layer 664. In one embodiment, the distal dielectric material layer 668 can comprise, and/or can consist essentially of, undoped silicate glass formed by decomposition of tetraethylorthosilicate (TEOS). In this case, the distal dielectric material layer 668 can include hydrogen atoms at an atomic concentration greater than 3 part per million (p.p.m.) and carbon atoms at an atomic concentration greater than 1 part per million, which may be caused by incorporation of impurities during decomposition of TEOS or by incorporation of a residual solvent material during application of a spin-on-glass material. For example, the distal dielectric material layer 668 can include hydrogen atoms at an atomic concentration in a range from 3 p.p.m. to 1,000 p.p.m., and can include carbon atoms at an atomic concentration in a range from 1 p.p.m. to 300 p.p.m. In one embodiment, the atomic concentration of hydrogen atoms in the proximal dielectric material layer 664 may be greater than the atomic concentration of hydrogen atoms in the distal dielectric material layer 668 by a factor of at least 2, such as by a factor in a range from 3 to 30. In this case, the higher atomic concentration of hydrogen atoms in the first dielectric material of the proximal dielectric material layer 664 can provide a higher etch rate relative to the etch rate of the second dielectric material of the distal dielectric material layer 668 in an etch process to be subsequently employed.

Optionally, the second dielectric material can be subsequently planarized to provide a horizontal top surface, for example, by performing a chemical mechanical polishing (CMP) process. In case the top surface of the second dielectric material is planarized, the top surface of the distal dielectric material layer 668 may be formed within a third horizontal plane HP3 that overlies the second horizontal plane HP2 and overlies the horizontal plane including the top surface of the gate stack structure (750, 752, 754, 758, 755, 756). In one embodiment, the top surface of the distal dielectric material layer 668 may be formed above, or at, the horizontal plane including the topmost surface of the at least one dielectric liner (661, 662), such as the top surface of a portion of the silicon nitride liner 662 that overlies the gate stack structure (750, 752, 754, 758, 755, 756). The vertical distance between the third horizontal plane HP3 and the and the horizontal plane including the topmost surface of the horizontal plane including the topmost surface of the at least one dielectric liner (661, 662) may be in a range from 0 nm to 400 nm, such as from 50 nm to 200 nm, although lesser and greater thicknesses may also be employed.

Figure 6:
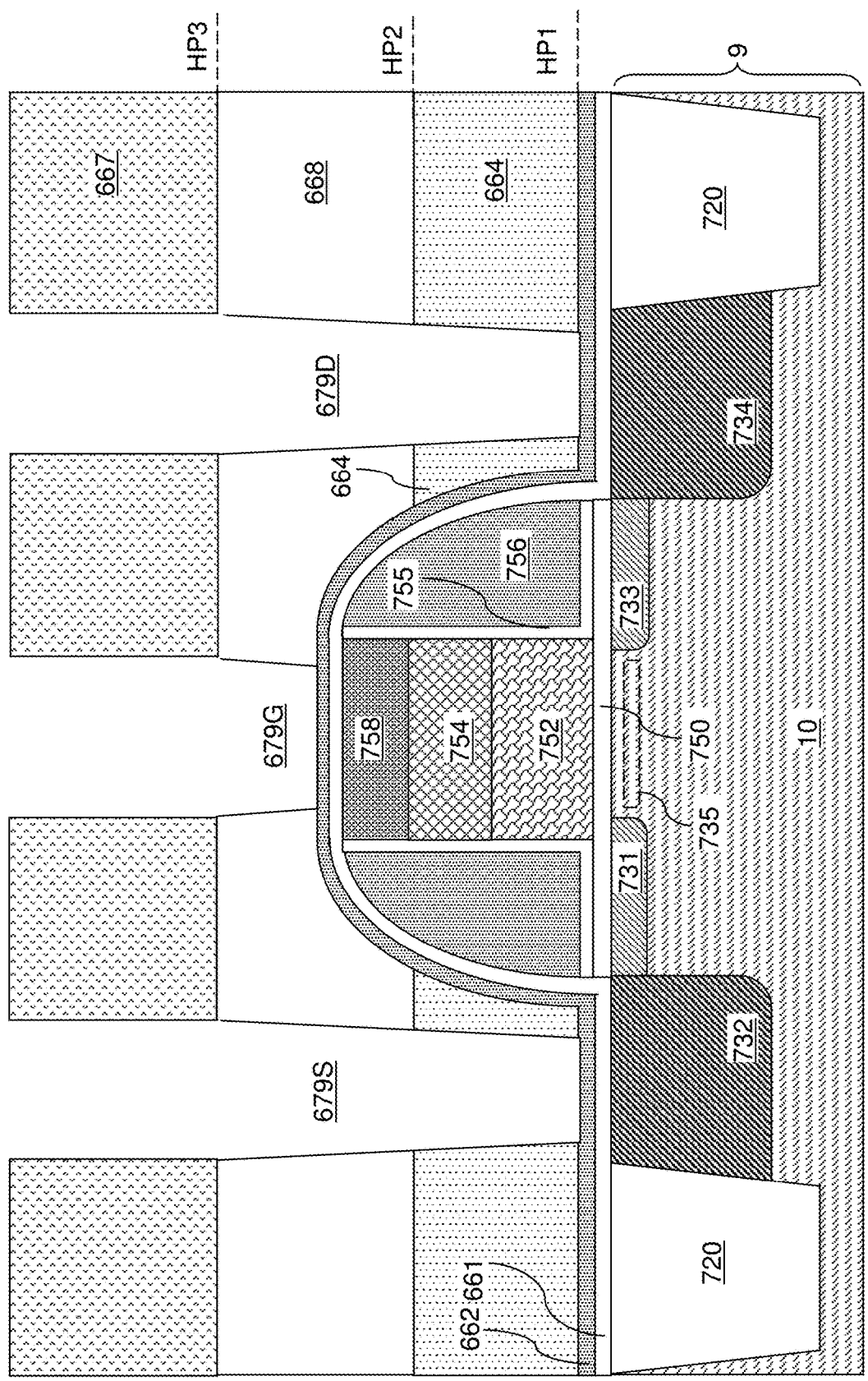
FIG. 6 is a vertical cross-sectional view of the first exemplary structure after formation of contact via cavities according to the first embodiment of the present disclosure.

Referring to FIG. 6, a photoresist layer 677 can be applied over the stack of the proximal dielectric material layer 664 and the distal dielectric material layer 668, and can be lithographically patterned to form contact openings in areas in which contact via structures are to be subsequently formed. For example, openings in the photoresist layer can be formed within areas of gate electrode (752, 754), the first active region (731, 732), and the second active region (733, 734) by lithographic exposure and development of the photoresist layer 677.

The pattern of the openings in the photoresist layer 677 can be transferred through the distal dielectric material layer 668 and the proximal dielectric material layer 664 by a first anisotropic etch process. The chemistry of the first anisotropic etch process can be selected such that the distal dielectric material layer 668 and the proximal dielectric material layer 664 are sequentially etched selective to the material of at least one dielectric liner (661, 662). For example, the chemistry of the first anisotropic etch process may be selective to the material of the silicon nitride liner 662, i.e., silicon nitride. In this case, an anisotropic etch chemistry that etches silicate glass or a polymer material selective to silicon nitride may be employed.

Contact via cavities (679S, 679D, 679G) are formed through the stack of the proximal dielectric material layer 664 and the distal dielectric material layer 668. The contact via cavities (679S, 679D, 679G) can include a first contact via cavity 679S that vertically extends from the top surface of the stack of the proximal dielectric material layer 664 and the distal dielectric material layer 668 to a segment of a top surface of the at least one dielectric liner (661, 662) that overlies the deep source region 732, a second contact via cavity 679D that vertically extends from the top surface of the stack of the proximal dielectric material layer 664 and the distal dielectric material layer 668 to a segment of a top surface of the at least one dielectric liner (661, 662) that overlies the deep drain region 734, and a third contact via cavity 679G that vertically extends from the top surface of the stack of the proximal dielectric material layer 664 and the distal dielectric material layer 668 to a surface of a segment of a top surface of the at least one dielectric liner (661, 662) that overlies the gate stack structure (750, 752, 754, 758, 755, 756).

The first contact via cavity 679S is also referred to as a source-contact via cavity. The second contact via cavity 679D is also referred to as a drain-contact via cavity. The first contact via cavity 679S and the second contact via cavity 679D are herein collectively referred to as active-region contact via cavities (679S, 679D). The third contact via cavity 679G is also referred to as a gate-contact via cavity. Each of the contact via cavities (679S, 679D, 679G) may have a respective horizontal cross-sectional shape of a circle, an ellipse, a rectangle, a rounded rectangle, or a generally two-dimensional shape having a closed periphery.

Figure 7:
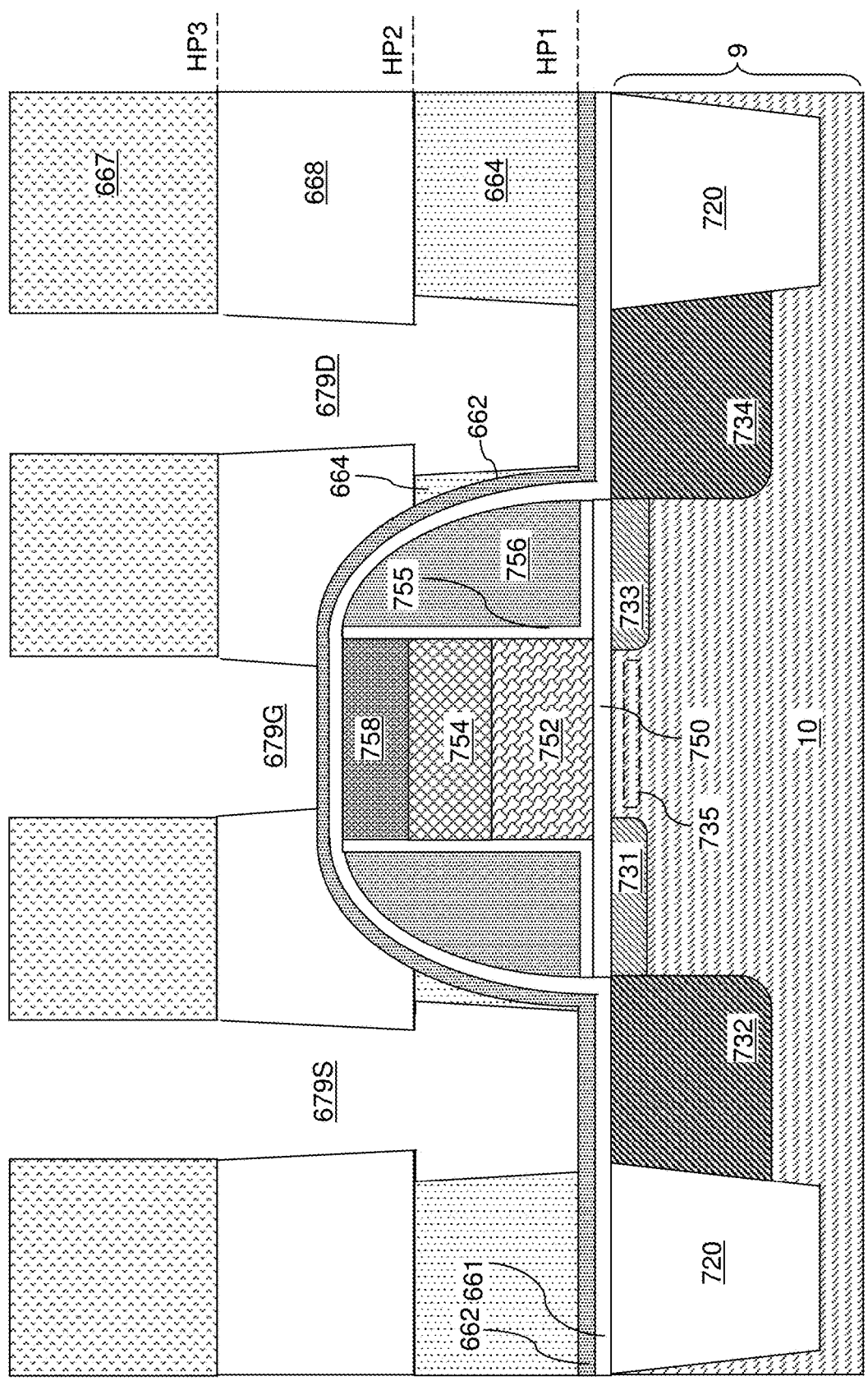
FIG. 7 is a vertical cross-sectional view of the first exemplary structure after laterally expanding lower portions of the active-region contact via cavities according to the first embodiment of the present disclosure.

Referring to FIG. 7, lower portions of the active-region contact via cavities (679S, 679D) can be laterally expanded by performing an isotropic etch process that etches the first dielectric material at an etch rate that is least three times higher than the etch rate of the second dielectric material. Generally, an etch process that etches a first material is "selective to" a second material is the etch process etches the first material at an etch rate that is at least three times, such as ten times or more, than the etch rate of the second material. Thus, the isotropic etch process that etches the first dielectric material of the proximal dielectric material layer 664 can be selective to the second dielectric material of the distal dielectric material layer 668. In this case, the lower portion of each of the first contact via cavity 679S and the second contact via cavity 679D can be isotropically expanded by etching the first dielectric material around the first contact via cavity 679S and the second contact via cavity 679D selective to the second dielectric material. In an illustrative example, the first dielectric material of the proximal dielectric material layer 664 may comprise borosilicate glass, fluorosilicate glass, borophosphosilicate glass, porous or nonporous organosilicate glass, or a low-k spin-on polymer material, and the second dielectric material of the distal dielectric material layer 668 comprises undoped silicate glass, nitrogen-doped organosilicate glass, silicon carbide nitride, or another low-k spin-on polymer material having a greater etch resistance than the first dielectric material of the proximal dielectric material layer 664, and the isotropic etch process may comprise a wet etch process employing dilute hydrofluoric (DHF) acid or a vapor phase etch process employing a vapor of hydrofluoric acid. The etch distance of the isotropic etch process may be in a range from 0.5 nm to 30 nm, such as from 1 nm to 10 nm, although lesser and greater etch distances may also be employed. In one embodiment, the maximum lateral dimension of a lower portion of each active-region contact via cavity (679S, 679D) located at a level of the proximal dielectric material layer 664 (such as topmost portion of the proximal dielectric material layer 664) can be greater than the maximum lateral dimension of the upper portion of the respective active-region contact via cavity (679S, 679D) located at a level of the distal dielectric material layer 668 (such as topmost portion of the distal dielectric material layer 668).

In one embodiment, upon lateral expansion of the lower portions of the first contact via cavity 679S and the second contact via cavity 679D, each of the first contact via cavity 679S and the second contact via cavity 679D may comprise an upper straight sidewall that extends through the distal dielectric material layer 668, a lower straight sidewall that extends through the proximal dielectric material layer 664, and a horizontal connecting surface that connects a bottom edge of the upper straight sidewall to a top edge of the lower straight sidewall. In case the distal dielectric material layer 668 is formed directly on the top surface of the proximal dielectric material layer 664, the horizontal connecting surface can be an annular segment of a bottom surface of the distal dielectric material layer 668. In one embodiment, the top edge of the lower straight sidewall and the bottom edge of the upper straight sidewall of each of the first contact via cavity 679S and the second contact via cavity 679D may be located within the second horizontal plane HP2. For each of the first contact via cavity 679S and the second contact via cavity 679D, the top edge of the lower straight sidewall can be laterally offset outward from the bottom edge of the upper straight sidewall by a uniform lateral offset distance, which can be the same as the etch distance of the isotropic etch process.

In one embodiment, all sidewall surfaces of each of the first contact via cavity 679S and the second contact via cavity 679D located between the first horizontal plane HP1 and the second horizontal plane HP2 may be laterally offset from vertically-extending surfaces of the at least one dielectric liner (661, 662). Alternatively, a lower portion of a vertically-extending surface of the at least one dielectric liner (661, 662) may be physically exposed to one or both of the first contact via cavity 679S and the second contact via cavity 679D. In this case, the height of the highest point within the portion of the vertically-extending surface of the at least one dielectric liner (661, 662) that is exposed to one or both of the first contact via cavity 679S and the second contact via cavity 679D may be located below the second horizontal plane HP2, or may be located within the second horizontal plane HP2, depending on the locations of the first contact via cavity 679S and the second contact via cavity 679D and depending on the etch distance of the isotropic etch process that laterally expands the lower portions of the first contact via cavity 679S and the second contact via cavity 679D.

Figure 8:
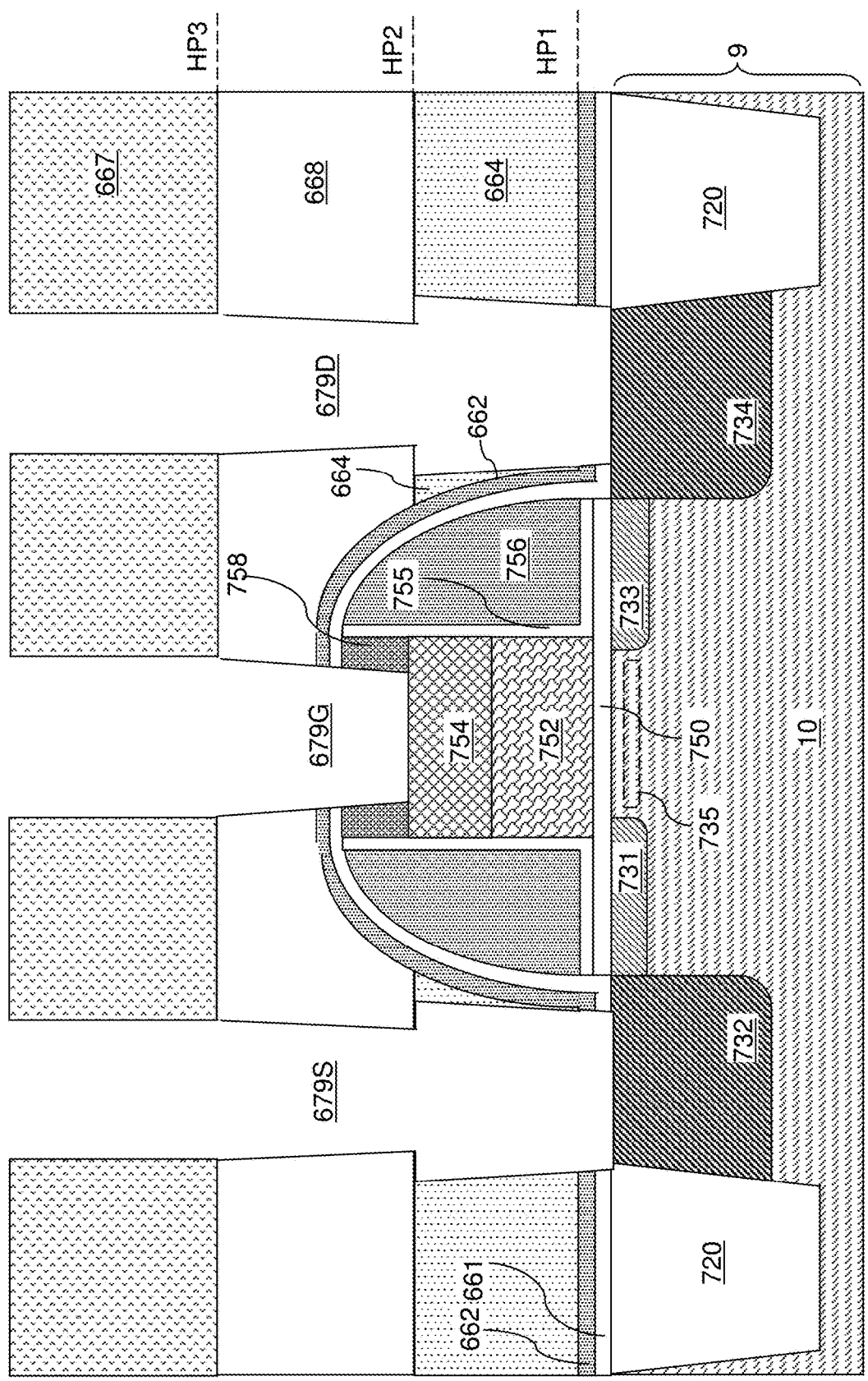
FIG. 8 is a vertical cross-sectional view of the first exemplary structure after etching through the at least one dielectric liner according to the first embodiment of the present disclosure.

Referring to FIG. 8, a second anisotropic etch process can be performed to etch unmasked portions of the at least one dielectric liner (661, 662) and the gate cap dielectric 758 selective to the materials of the deep active regions (732, 734) and selective to a material of the gate electrode (752, 754) (such as the material of the metallic gate electrode portion 754). The second anisotropic etch process forms openings through the at least one dielectric liner (661, 662) underneath the first contact via cavity 679S and the second contact via cavity 679D. The first contact via cavity 679S and the second contact via cavity 679D can be vertically extended through horizontally-extending portions of the at least one dielectric liner (661, 662) that overlie the deep active regions (732, 734) by the second anisotropic etch process after the lower portions of the first contact via cavity 679S and the second contact via cavity 679D are laterally expanded.

A physically exposed portion of the top surface of the first active region (731, 732) may be optionally vertically recessed below the horizontal plane including the top surface of the substrate semiconductor layer 10. Likewise, a physically exposed portion of the top surface of the second active region (733, 734) may be optionally vertically recessed below the horizontal plane including the top surface of the substrate semiconductor layer 10. The vertical recess distance of the recessed surfaces of the first active region (731, 732) and the second active region (733, 734) may be in a range from 0 nm to 30 nm, such as from 0.5 nm to 5 nm, although lesser and greater vertical recess distances may also be employed. A top surface of the gate electrode (752, 754) is physically exposed below the third contact via cavity 679G. The photoresist layer can be removed from above the stack of the proximal dielectric material layer 664 and the distal dielectric material layer 668, for example, by ashing.

Figure 9:
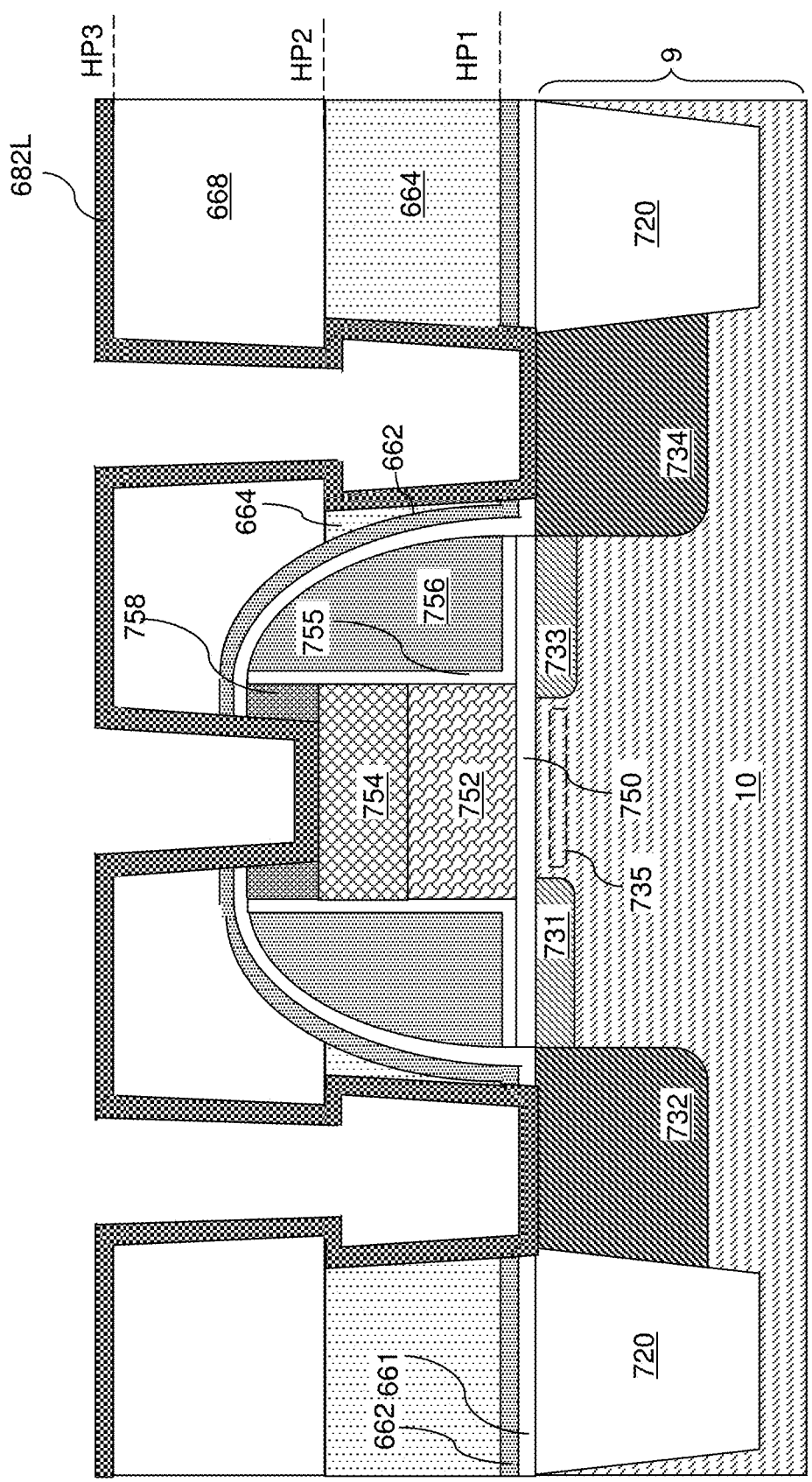
FIG. 9 is vertical cross-sectional view of the first exemplary structure after formation of a metallic nitride liner layer according to the first embodiment of the present disclosure.

Referring to FIG. 9, an optional metallic nitride liner layer 682L can be deposited in each of the contact via cavities (670S, 679D, 679G) and over the distal dielectric material layer 668. The metallic nitride liner layer 682L may be deposited by a conformal deposition process (such as a chemical vapor deposition process or an atomic layer deposition process) or a non-conformal deposition process (such as a physical vapor deposition process). In one embodiment, the metallic nitride liner layer 682L may be deposited by a conformal deposition process, and may have the same thickness throughout. In one embodiment, the metallic nitride liner layer 682L can include, and/or can consist essentially of, at least one conductive metallic nitride material such as TiN, TiSiN, TaN, and/or WN. The metallic nitride liner layer 682L may include a single metallic nitride material layer or a layer stack of a plurality of metallic nitride material layers. The thickness of the metallic nitride liner layer 682L on sidewalls of the contact via cavities (670S, 679D, 679G) may be in a range from 1 nm to 60 nm, such as from 3 nm to 20 nm, although lesser and greater thicknesses may also be employed.

Figure 10:
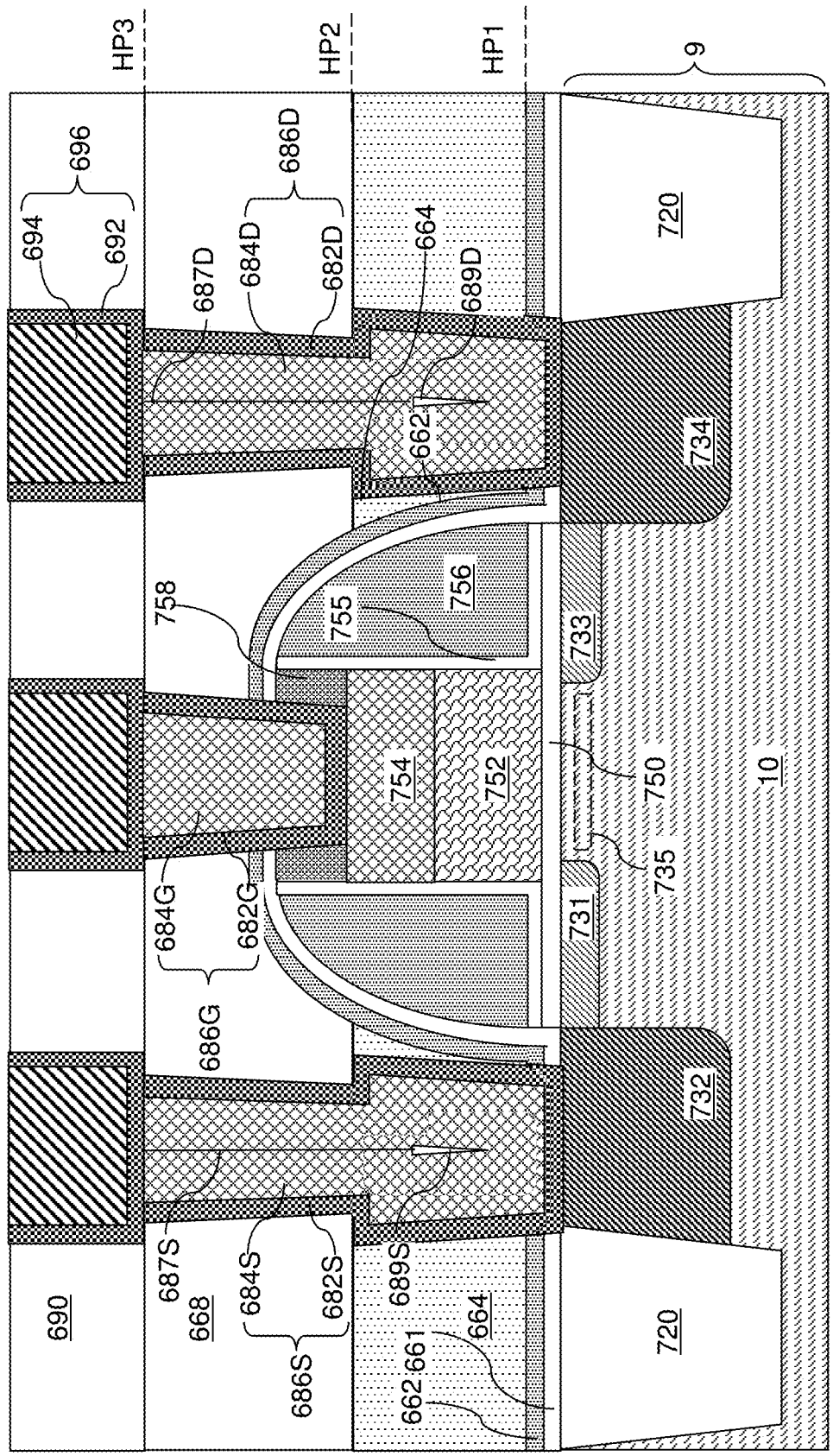
FIG. 10 is a vertical cross-sectional view of the first exemplary structure after formation of contact via structures, a line-level dielectric material layer, and metal lines according to the first embodiment of the present disclosure.

Referring to FIG. 10, a metallic fill material such as W, Cu, Ru, Co, and/or Mo can be deposited in remaining volumes of the various via cavities. The metallic fill material may be deposited by chemical vapor deposition, physical vapor deposition, and/or electroplating. The metallic fill material can be deposited such that remaining volumes of the various via cavities are filled with the metallic fill material. Excess portions of the metallic fill material and the metallic nitride material of the metallic nitride liner layer 682L can be removed from above the horizontal plane including the top surface of the distal dielectric material layer 668, i.e., from above the third horizontal plane HP3, by a planarization process such as chemical mechanical polishing (CMP).

A remaining portion of the metallic nitride liner layer 682L in the first contact via cavity 679S constitutes a first metallic nitride liner 682S. The first metallic nitride liner 682S is formed on the top surface of the first active region (731, 732) and on sidewalls of the first contact via cavity 679S. A remaining portion of the metallic fill material in the first contact via cavity 679S constitutes a first metallic fill material portion 684S. The combination of the first metallic nitride liner 682S and the first metallic fill material portion 684S constitutes a first contact via structure 686S.

A remaining portion of the metallic nitride liner layer 682L in the second contact via cavity 679D constitutes a second metallic nitride liner 682D. The second metallic nitride liner 682D is formed on the top surface of the second active region (733, 734) and on sidewalls of the second contact via cavity 679D. A remaining portion of the metallic fill material in the second contact via cavity 679D constitutes a second metallic fill material portion 684D. The combination of the second metallic nitride liner 682D and the second metallic fill material portion 684D constitutes a second contact via structure 686D.

A remaining portion of the metallic nitride liner layer 682L in the third contact via cavity 679G constitutes a third metallic nitride liner 682G. The third metallic nitride liner 682G is formed on the top surface of the gate electrode (752, 754) and on a sidewall of the gate cap dielectric 758. A remaining portion of the metallic fill material in the third contact via cavity 679G constitutes a third metallic fill material portion 684G. The combination of the third metallic nitride liner 682G and the third metallic fill material portion 684G constitutes a third contact via structure 686G.

Generally, the first contact via structure 686S can be formed in the first contact via cavity 679S on a top surface of the first active region (731, 732), and the second contact via structure 686D can be formed in the second contact via cavity 679D on a top surface of the second active region (733, 734). The first contact via structure 686S vertically extends through the distal dielectric material layer 668 and the proximal dielectric material layer 664, contacts a top surface of the first active region (731, 732), and has an upper sidewall contacting the distal dielectric material layer 668, a lower sidewall that extends through the proximal dielectric material layer 664, and a horizontal connecting surface that connects a bottom edge of the upper sidewall to a top edge of the lower sidewall. The second contact via structure 686D vertically extends through the distal dielectric material layer 668 and the proximal dielectric material layer 664, contacts a top surface of the second active region (733, 734), and has an upper sidewall contacting the distal dielectric material layer 668, a lower sidewall that extends through the proximal dielectric material layer 664, and a horizontal connecting surface that connects a bottom edge of the upper sidewall to a top edge of the lower sidewall.

Each horizontal connecting surface of the first contact via structure 686S and the second contact via structure 686D can contact an overlying dielectric surface. In case the distal dielectric material layer 668 is formed directly on a top surface of the proximal dielectric material layer 664, the overlying dielectric surface comprises a portion of a bottom surface of the distal dielectric material layer 668. In one embodiment, the horizontal connecting surface has an inner periphery and an outer periphery, and a lateral distance between the inner periphery and the outer periphery is uniform throughout the horizontal connecting surface.

In one embodiment, the entirety of the top surface of the proximal dielectric material layer 664 can be located within the second horizontal plane HP2, and the entirety of the horizontal connecting surface of the first contact via structure 686S and the entirety of the horizontal connecting surface of the second contact via structure 686D can be located within the second horizontal plane HP2.

In one embodiment, at least one dielectric liner (661, 662) may overlie a top surface of the semiconductor substrate 9 and the gate stack structure (750, 752, 754, 758, 755, 756). The entirety of a contact area between the first contact via structure 686S and the at least one dielectric liner (661, 662) may be located at, or below, the first horizontal plane HP1, which includes a top surface of a horizontally-extending portion of the at least one dielectric liner (661, 662) that overlies the semiconductor substrate 9 and is laterally spaced from the gate stack structure (750, 752, 754, 758, 755, 756), i.e., does not have an areal overlap with the gate stack structure (750, 752, 754, 758, 755, 756) in a plan view.

In one embodiment, the lateral extent of the first contact via structure 686S within a plane including the top surface of the proximal dielectric material layer 664 (i.e., the second horizontal plane HP2) is greater than a lateral extent of the first contact via structure 686S within a plane including a top surface of the distal dielectric material layer 668 (i.e., the third horizontal plane HP3). In one embodiment, the lateral extent of the second contact via structure 686D within a plane including the top surface of the proximal dielectric material layer 664 (i.e., the second horizontal plane HP2) is greater than a lateral extent of the second contact via structure 686D within a plane including a top surface of the distal dielectric material layer 668 (i.e., the third horizontal plane HP3).

In one embodiment, the lateral extent of the first contact via structure 686S just below a plane including the top surface of the proximal dielectric material layer 664 (i.e., the second horizontal plane HP2) is greater than a lateral extent of the first contact via structure 686S just above the same plane including a bottom surface of the distal dielectric material layer 668 (i.e., the same second horizontal plane HP2). In one embodiment, the lateral extent of the second contact via structure 686D just below the plane including the top surface of the proximal dielectric material layer 664 (i.e., the second horizontal plane HP2) is greater than a lateral extent of the second contact via structure 686D just above the plane including a top surface of the distal dielectric material layer 668 (i.e., the same second horizontal plane HP2). Thus, the first and the second contact via structures (688S, 686D) have a step in their sidewalls at the interface between the proximal and the distant dielectric material layers (664, 668).

In one embodiment, the first contact via structure 686S comprises a first metallic nitride liner 682S that continuously extends from a horizontal plane including a top surface of the distal dielectric material layer 668 (i.e., from the third horizontal plane HP3) to a top surface of the first active region (731, 732), and a first metallic fill material portion 684S embedded in the first metallic nitride liner 682S and having a top surface within the horizontal plane including the top surface of the distal dielectric material layer 688. In one embodiment, the second contact via structure 686D comprises a second metallic nitride liner 682D that continuously extends from a horizontal plane including a top surface of the distal dielectric material layer 668 (i.e., from the third horizontal plane HP3) to a top surface of the second active region (733, 734), and a second metallic fill material portion 684D embedded in the second metallic nitride liner 682D and having a top surface within the horizontal plane including the top surface of the distal dielectric material layer 688.

In one embodiment, the deposition process that deposits the metallic fill material of the first metallic fill material portion 684S and the second metallic fill material portion 684D may optionally form voids (689S, 689D) within the first metallic fill material portion 684S and the second metallic fill material portion 684D. Further, optional seams (687S, 687D) may vertically extend from a respective void (689S, 689D) within the first metallic fill material portion 684S and the second metallic fill material portion 684D to the horizontal plane including the top surface of the distal dielectric material layer 668 (i.e., the third horizontal plane HP3) within each of the first metallic fill material portion 684S and the second metallic fill material portion 684D. The seams (687S, 687D) may comprise a one-dimensional seam (i.e., line-shaped seam) or a two-dimensional seam (i.e., a strip-shaped seam).

In one embodiment, the first contact via structure 686S comprises a void 689S embedded within a region of the first metallic fill material portion 684S that underlies a horizontal plane including the top surface of the proximal dielectric material layer 664 (i.e., the second horizontal plane HP2), and a vertically-extending seam 687S that extends from the void 689S to a horizontal plane including a top surface of the distal dielectric material layer 668 (i.e., the third horizontal plane HP3). In one embodiment, the second contact via structure 686D comprises a void 689D embedded within a region of the second metallic fill material portion 684D that underlies a horizontal plane including the top surface of the proximal dielectric material layer 664 (i.e., the second horizontal plane HP2), and a vertically-extending seam 687D that extends from the void 689D to a horizontal plane including a top surface of the distal dielectric material layer 668 (i.e., the third horizontal plane HP3).

A line-level dielectric layer 690 can be deposited over the distal dielectric material layer 668. The line-level dielectric layer 690 includes a dielectric material such as undoped silicate glass, a doped silicate glass, and/or porous or non-porous organosilicate glass. The thickness of the line-level dielectric layer 690 can be in a range from 100 nm to 300 nm, although lesser and greater thicknesses can also be employed. Line cavities are formed in the line-level dielectric layer 690 over a respective one of the composite contact via structures (676S, 676D, 676G). At least one metallic material can be deposited in the line cavities, and excess portions of the at least one metallic material can be removed from above the horizontal plane including the top surface of the line-level dielectric layer 690 by a planarization process such as a chemical mechanical planarization process. Remaining portions of the at least one metallic material in the line cavities include metal lines 696. Each metal line 696 can include a metallic liner 692 including a metallic nitride material (such as TiN, TaN, and/or WN), and a metallic fill material portion 694 including a metallic fill material (such as Cu, W, Ti, Ta, Mo, Ru, Co, and/or a combination thereof).

Figure 11:
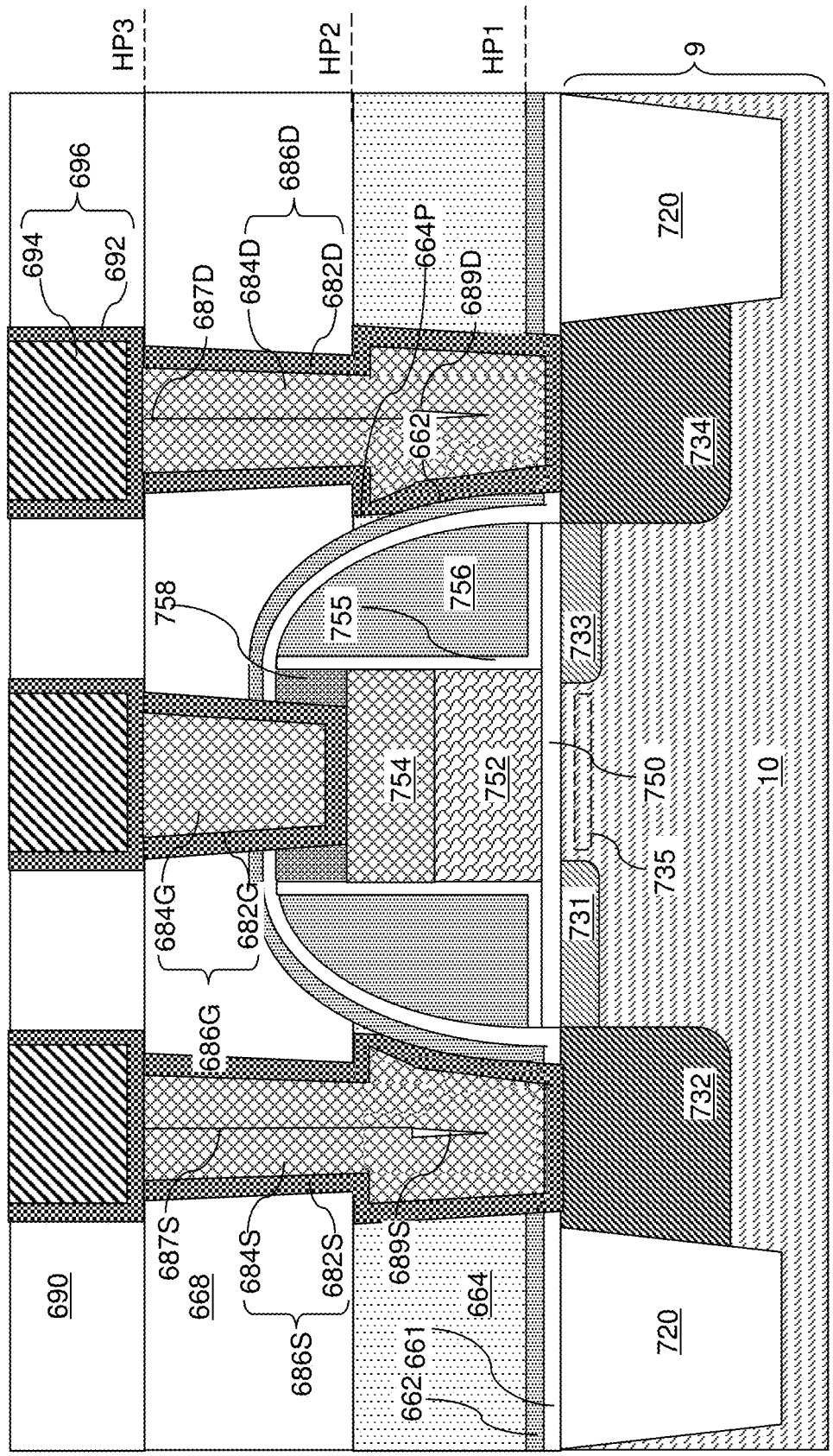
FIG. 11 is a vertical cross-sectional view of a first alternative configuration of the first exemplary structure according to the first embodiment of the present disclosure.

Referring to FIG. 11, a first alternative configuration of the first exemplary structure can be derived from the first exemplary structure by positioning the first contact via cavity 679S and/or the second contact via cavity 679D and/or by increasing the etch distance of the isotropic etch process that laterally expands the lower portions of the first contact via cavity 679S and the second contact via cavity 679D such that a portion of an outer sidewall of the vertically-extending portion of the at least one dielectric liner (661, 662) (such as the silicon nitride liner 662) is physically exposed to at least one of the first contact via cavity 679S and/or the second contact via cavity 679D. A portion 664P of the proximal dielectric material layer 664 is interposed between the first contact via cavity 679S or the second contact via cavity 679D and the outer sidewall of the vertically-extending portion of the at least one dielectric liner (661, 662). Thus, the entirety of the surface segment(s) of the outer sidewall of the vertically-extending portion of the at least one dielectric liner (661, 662) that is physically exposed to the first contact via cavity 679S and/or the second contact via cavity 679D can be located below, and can be vertically spaced from, the second horizontal plane HP2.

In this case, at least one dielectric liner (661, 662) overlies a top surface of the semiconductor substrate 9 and overlying the gate stack structure (750, 752, 754, 758, 755, 756), and a topmost edge of a contact area between the first contact via structure 686S and the at least one dielectric liner (661, 662) is located above the first horizontal plane HP1 including a top surface of a horizontally-extending portion of the at least one dielectric liner (661, 662) that overlies the semiconductor substrate 9 and is laterally spaced from the gate stack structure (750, 752, 754, 758, 755, 756), and is located below a second horizontal plane HP2 including the top surface of the proximal dielectric material layer 664. Alternatively or additionally, a topmost edge of a contact area between the second contact via structure 686D and the at least one dielectric liner (661, 662) is located above the first horizontal plane HP1, and is located below a second horizontal plane HP2.

In one embodiment, a dielectric liner (such as the silicon nitride liner 662) overlies a top surface of the semiconductor substrate 9, and overlies the gate stack structure 750, 752, 754, 758, 755, 756). A first tapered or vertical portion of the dielectric liner may be collaterally thinned during the first anisotropic etch process that forms the first contact via cavity 679S and the second contact via cavity 679D. In this case, the first tapered or vertical portion of the dielectric liner contacting a sidewall of the first contact via structure 686S or the second contact via structure 686D may have a lesser thickness than a second tapered or vertical portion of the dielectric liner located above a horizontal plane including the top surface of the proximal dielectric material layer (i.e., the second horizontal plane HP2) (and thus, remains unetched), as well as less than a horizontally-extending portion of the dielectric liner that overlies the semiconductor substrate 9 (and thus, remains unetched).

Figure 12:
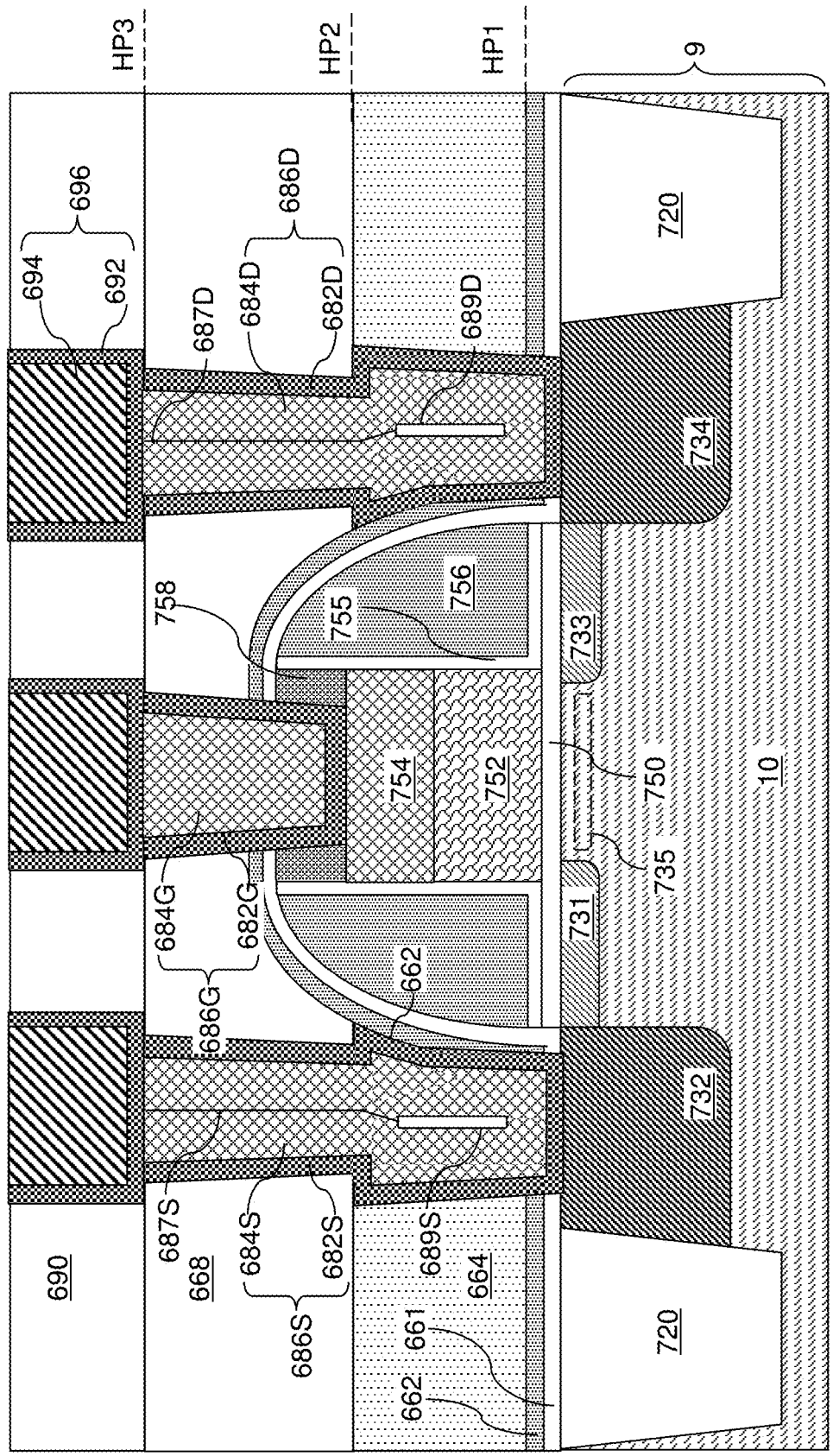
FIG. 12 is a vertical cross-sectional view of a second alternative configuration of the first exemplary structure according to the first embodiment of the present disclosure.

Referring to FIG. 12, a second alternative configuration of the first exemplary structure can be derived from the first exemplary structure by positioning the first contact via cavity 679S and/or the second contact via cavity 679D and/or by increasing the etch distance of the isotropic etch process that laterally expands the lower portions of the first contact via cavity 679S and the second contact via cavity 679D such that a portion of an outer sidewall of the vertically-extending portion of the at least one dielectric liner (661, 662) (such as the silicon nitride liner 662) is physically exposed to at least one of the first contact via cavity 679S and/or the second contact via cavity 679D. In this case, the physically exposed portion of the at least one dielectric liner (661, 662) may continuously extend between the first horizontal plane HP1 and the second horizontal plane HP2.

In this case, at least one dielectric liner (661, 662) overlies a top surface of the semiconductor substrate 9 and overlying the gate stack structure (750, 752, 754, 758, 755, 756), and a topmost edge of a contact area between the first contact via structure 686S and the at least one dielectric liner (661, 662) is located at a horizontal plane including the top surface of the proximal dielectric material layer 664, i.e., within the second horizontal plane HP2. Alternatively or additionally, a topmost edge of a contact area between the second contact via structure 686D and the at least one dielectric liner (661, 662) is located within the second horizontal plane HP2.

In one embodiment, a dielectric liner (such as the silicon nitride liner 662) overlies a top surface of the semiconductor substrate 9, and overlies the gate stack structure (750, 752, 754, 758, 755, 756). A first tapered or vertical portion of the dielectric liner may be collaterally thinned during the first anisotropic etch process that forms the first contact via cavity 679S and the second contact via cavity 679D. In this case, the first tapered or vertical portion of the dielectric liner contacting a sidewall of the first contact via structure 686S or the second contact via structure 686D may have a lesser thickness than a second tapered or vertical portion of the dielectric liner located above a horizontal plane including the top surface of the proximal dielectric material layer (i.e., the second horizontal plane HP2) (and thus, remains unetched), as well as less than a horizontally-extending portion of the dielectric liner that overlies the semiconductor substrate 9 (and thus, remains unetched).

Figure 13:
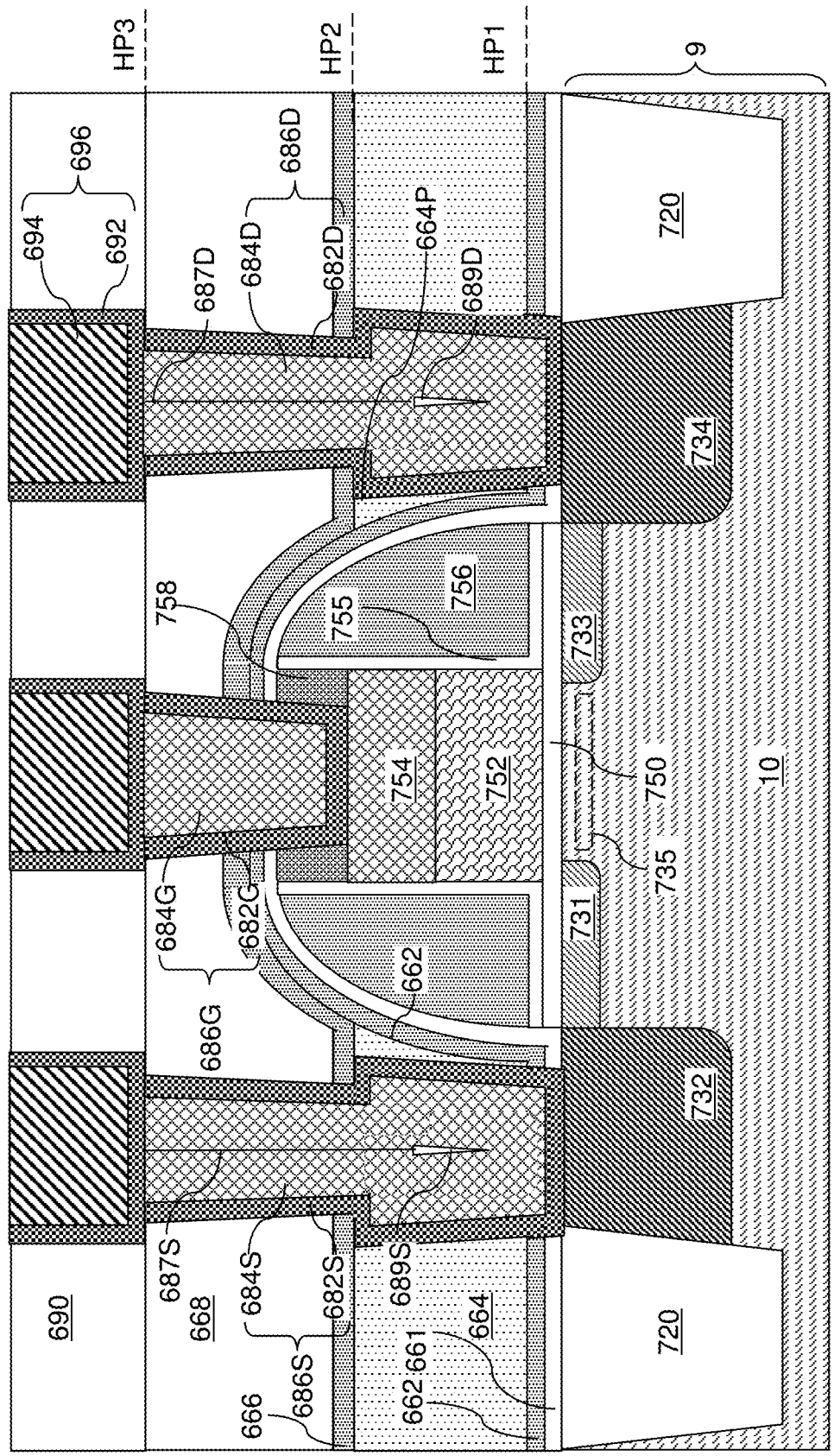
FIG. 13 is a vertical cross-sectional view of a second exemplary structure according to a second embodiment of the present disclosure.

Referring to FIG. 13, a second exemplary structure according to a second embodiment of the present disclosure can be derived from the first exemplary structure of FIG. 4 by depositing an etch stop dielectric layer 666 on the physically exposed surfaces of the proximal dielectric material layer 664 and the at least one dielectric liner (661, 662). The etch stop dielectric layer 666 includes a dielectric material that may function as a temporary etch stop layer during the first anisotropic etch process that is subsequently performed. For example, the etch stop dielectric layer 666 may include silicon nitride, silicon carbide nitride, or a dielectric metal oxide (such as aluminum oxide, titanium oxide, tantalum oxide, yttrium oxide, or lanthanum oxide). The etch stop dielectric layer 666 may be formed by a conformal deposition process or by a nonconformal deposition process. The thickness of the etch stop dielectric layer 666 may be in a range from 1 nm to 30 nm, such as from 3 nm to 10 nm, although lesser and greater thicknesses may also be employed.

Subsequently, the processing steps of FIGS. 5, 6, and 7 can be sequentially formed. In this case, the horizontal connecting surface of each of the first contact via cavity 679S and the second contact via cavity 679D that connects the bottom edge of the straight upper sidewall and the top edge of the straight lower sidewall may be a segment of the bottom surface of the etch stop dielectric layer 666, such as an annular segment of the bottom surface of the etch stop dielectric layer 666. The second horizontal plane HP2 may include the interface between the proximal dielectric material layer 664 and the etch stop dielectric layer 666.

Subsequently, the processing steps of FIGS. 8, 9, and 10 can be performed to provide the second exemplary structure illustrated in FIG. 13. Generally, the first contact via structure 686S can be formed in the first contact via cavity 679S on a top surface of the first active region (731, 732), and the second contact via structure 686D can be formed in the second contact via cavity 679D on a top surface of the second active region (733, 734). The first contact via structure 686S vertically extends through the distal dielectric material layer 668 and the proximal dielectric material layer 664, contacts a top surface of the first active region (731, 732), and has an upper sidewall contacting the distal dielectric material layer 668, a lower sidewall that extends through the proximal dielectric material layer 664, and a horizontal connecting surface that connects a bottom edge of the upper sidewall to a top edge of the lower sidewall. The second contact via structure 686D vertically extends through the distal dielectric material layer 668 and the proximal dielectric material layer 664, contacts a top surface of the second active region (733, 734), and has an upper sidewall contacting the distal dielectric material layer 668, a lower sidewall that extends through the proximal dielectric material layer 664, and a horizontal connecting surface that connects a bottom edge of the upper sidewall to a top edge of the lower sidewall.

Each horizontal connecting surface of the first contact via structure 686S and the second contact via structure 686D can contact an overlying dielectric surface. In case the etch stop dielectric layer 666 is formed directly on a top surface of the proximal dielectric material layer 664, the overlying dielectric surface comprises a portion of a bottom surface of the etch stop dielectric layer 666. The geometrical relationship within each of and among the first contact via structure 686S, the second contact via structure 686D, the at least one dielectric liner (661, 662), and the proximal dielectric material layer 664 may be the same as in the first exemplary structure illustrated in FIG. 10.

Figure 14:
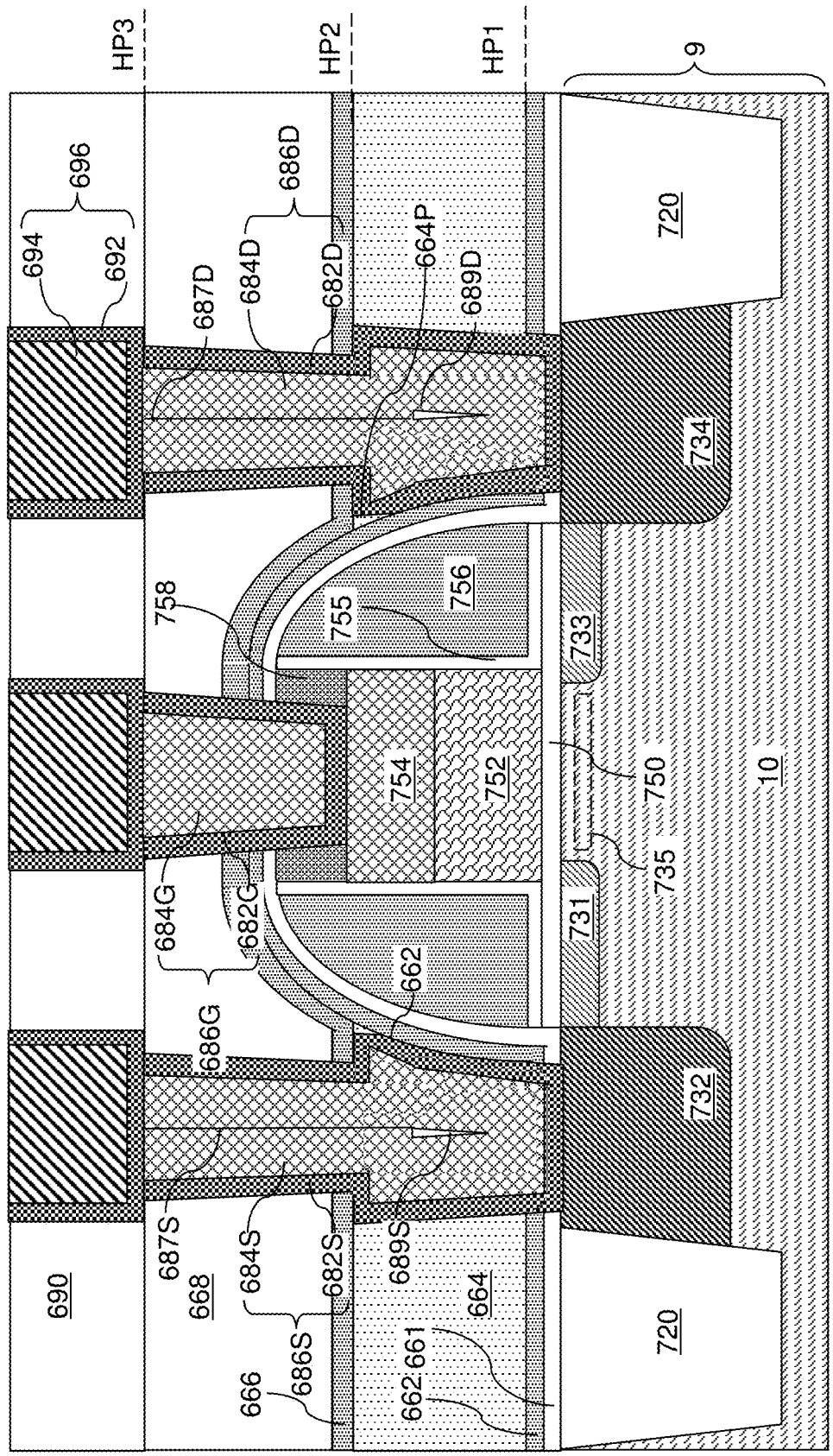
FIG. 14 is a vertical cross-sectional view of a first alternative configuration of the second exemplary structure according to the second embodiment of the present disclosure.

Referring to FIG. 14, a first alternative configuration of the second exemplary structure can be derived from the first alternative configuration of the first exemplary structure of FIG. 11 by inserting an etch stop dielectric layer 666 between the proximal dielectric material layer 664 and the distal dielectric material layer 668. The geometrical relationship within each of and among the first contact via structure 686S, the second contact via structure 686D, the at least one dielectric liner (661, 662), and the proximal dielectric material layer 664 may be the same as in the first exemplary structure illustrated in FIG. 11.

Figure 15:
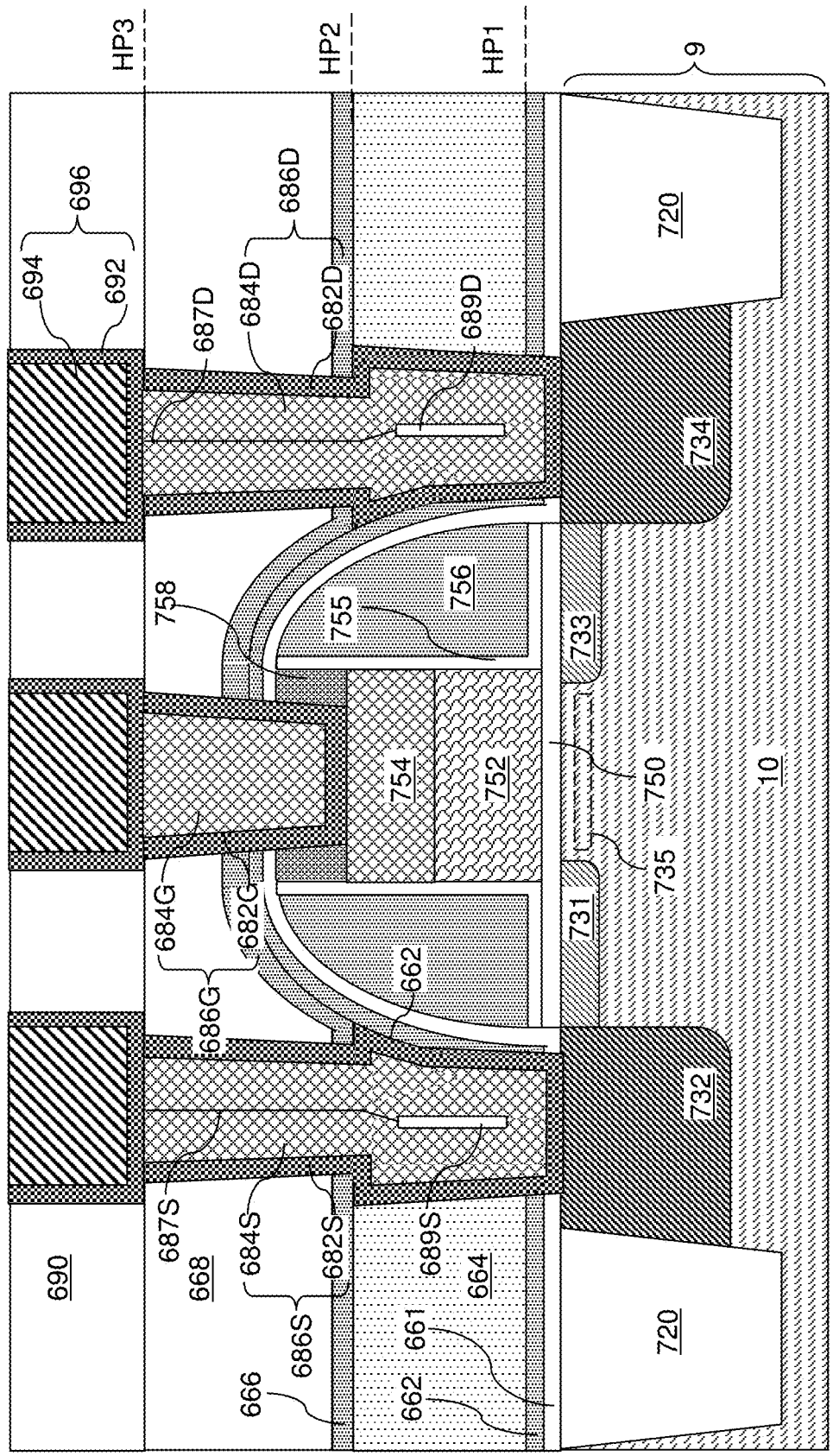
FIG. 15 is a vertical cross-sectional view of a second alternative configuration of the second exemplary structure according to the second embodiment of the present disclosure.

Referring to FIG. 15, a second alternative configuration of the second exemplary structure can be derived from the second alternative configuration of the first exemplary structure of FIG. 12 by inserting an etch stop dielectric layer 666 between the proximal dielectric material layer 664 and the distal dielectric material layer 668. The geometrical relationship within each of and among the first contact via structure 686S, the second contact via structure 686D, the at least one dielectric liner (661, 662), and the proximal dielectric material layer 664 may be the same as in the first exemplary structure illustrated in FIG. 12.

Figure 16:
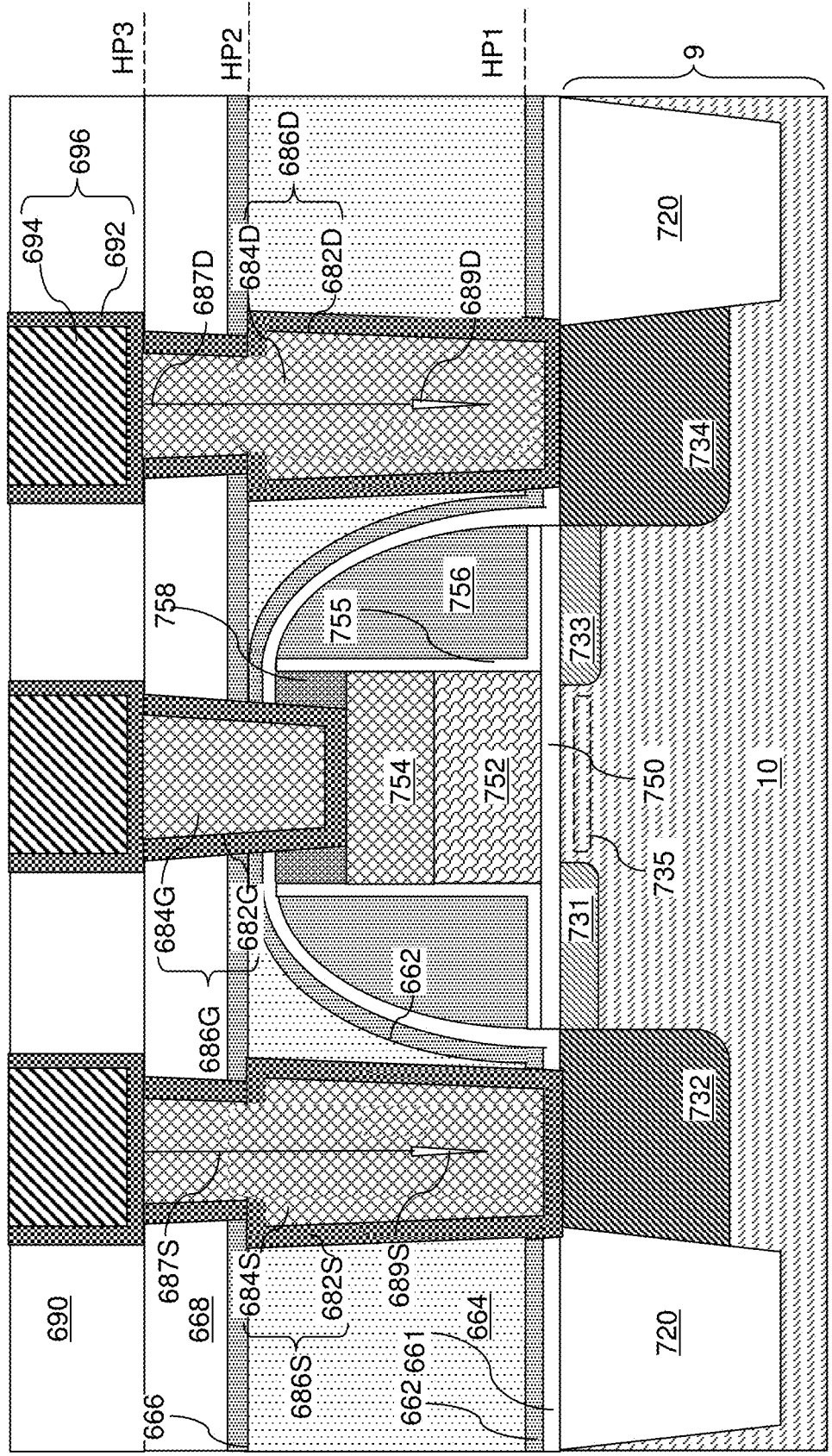
FIG. 16 is a vertical cross-sectional view of a second alternative configuration of the second exemplary structure according to the second embodiment of the present disclosure.

Referring to FIG. 16, a third alternative configuration of the second exemplary structure can be derived from the first exemplary structure of FIG. 13 by increasing the thickness of the proximal dielectric material layer 664. For example, the proximal dielectric material layer 664 may extend to or above the top surface of the gate stack structure (750, 752, 754, 758, 755, 756). Thus, the second horizontal plane HP2 may be located at or above the top surface of the gate stack structure (750, 752, 754, 758, 755, 756).

Figure 17:
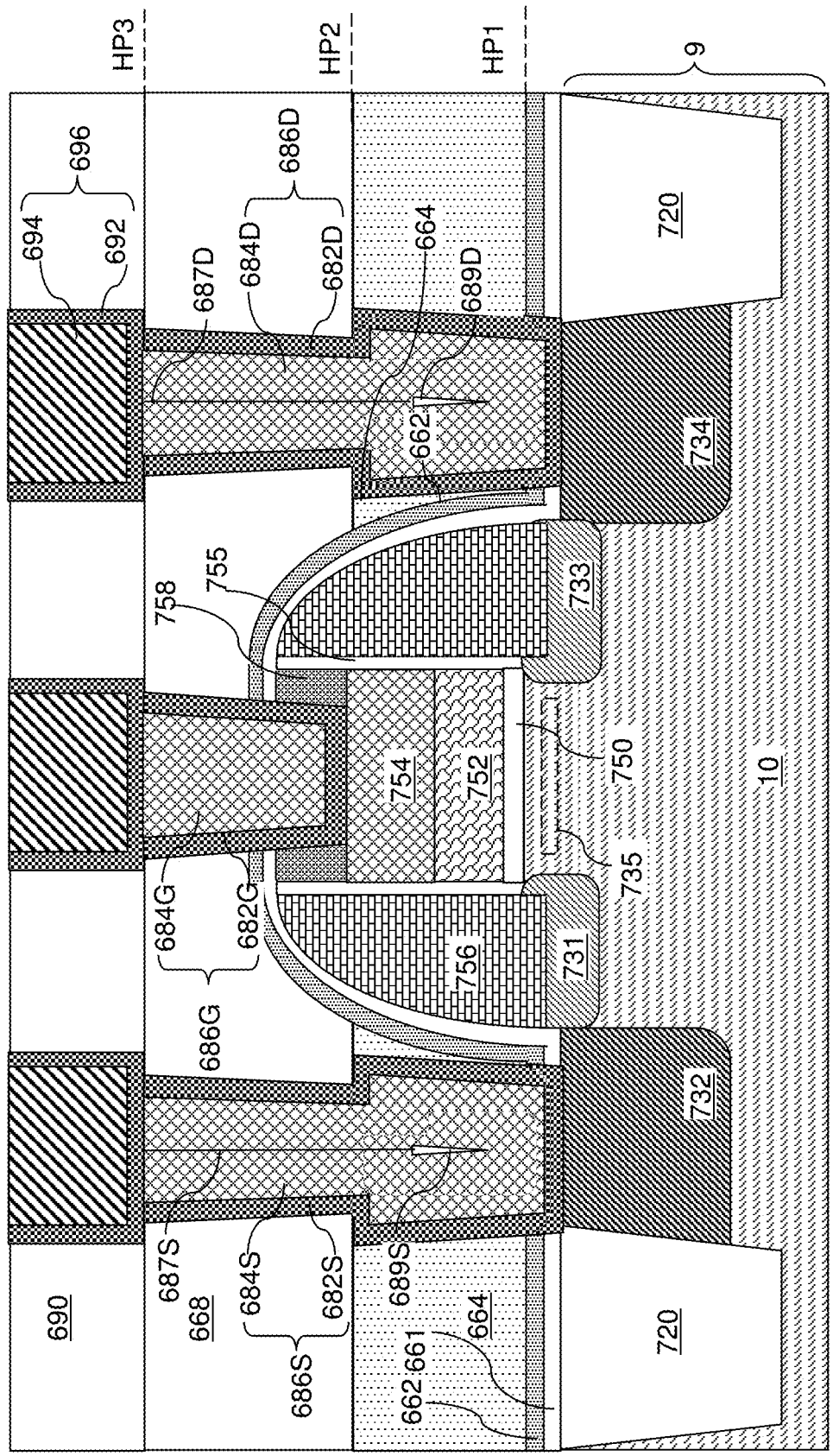
FIG. 17 is a vertical cross-sectional view of a third exemplary structure according to a third embodiment of the present disclosure.

FIG. 17 illustrates a third exemplary structure which comprises a field effect transistor with recessed active regions (i.e., source and drain regions). The third exemplary structure may be derived from the first exemplary structure shown in FIG. 10, by recessing the semiconductor substrate 9 by etching using the gate stack structure (750, 752, 754, 758, 755, 756) as a mask. The recess etch may be conducted after forming the gate stack structure (750, 752, 754, 758, 755, 756) but before implanting the shallow active regions (731, 733) shown in FIG. 2. The third exemplary structure may include the alternative features illustrated in any of the FIGS. 11, 12, 13, 14, 15 and/or 16.

FIGS. 18A-18D are vertical cross-sectional views of steps in fabrication of a fourth exemplary structure according to a fourth embodiment of the present disclosure. The fourth exemplary structure of FIG. 18A can be derived from the first exemplary structure of the first embodiment shown in FIG. 6. In the fourth exemplary structure of FIG. 18A, the bottoms of the source and drain contact via cavities (679S, 679D) expose the at least one dielectric liner (661, 662) located on the dielectric gate spacers 756, as shown by the dashed lines. In other words, the source and drain contact via cavities (679S, 679D) are offset inwards toward the gate stack and are located entirely over the inclined portion of the at least one dielectric liner (661, 662) located on the dielectric gate spacers 756.

Figure 18B:
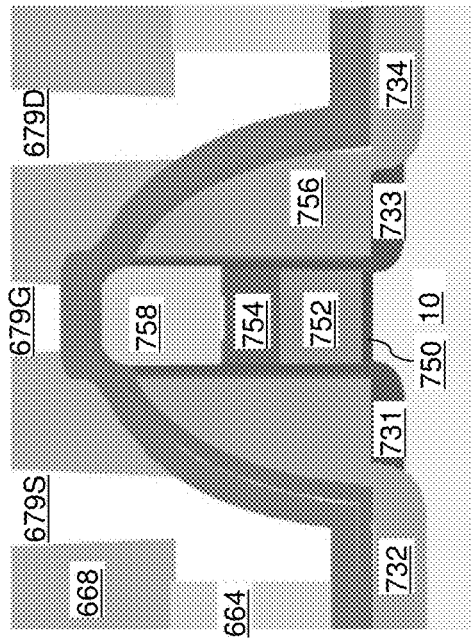
FIGS. 18A-18D are vertical cross-sectional views of steps in fabrication of a fourth exemplary structure according to a fourth embodiment of the present disclosure.

As shown in FIG. 18B, the isotropic etch described above with respect to FIG. 7 is performed. The proximal dielectric material layer 664 is laterally etched to laterally expand of the lower portions of the first contact via cavity 679S and the second contact via cavity 679D. After the isotropic etching step of FIG. 18B, the lower portions of the source contact via cavity 679S and the drain contact via cavity 679D overlap the horizontal portions of the at least one dielectric liner (661, 662) located over the deep source and drain regions (732, 734).

Figure 18D:
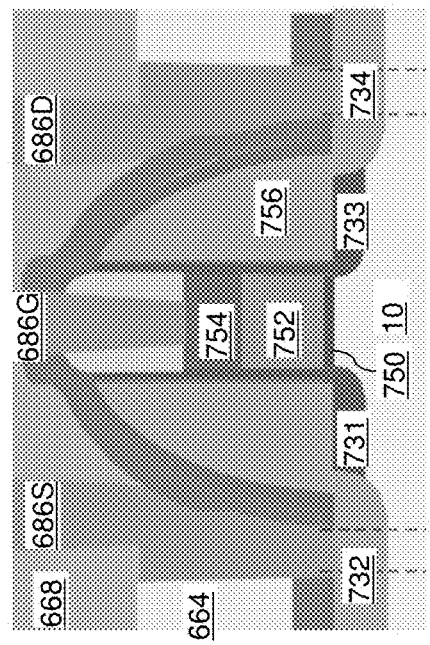
Figure 18A:
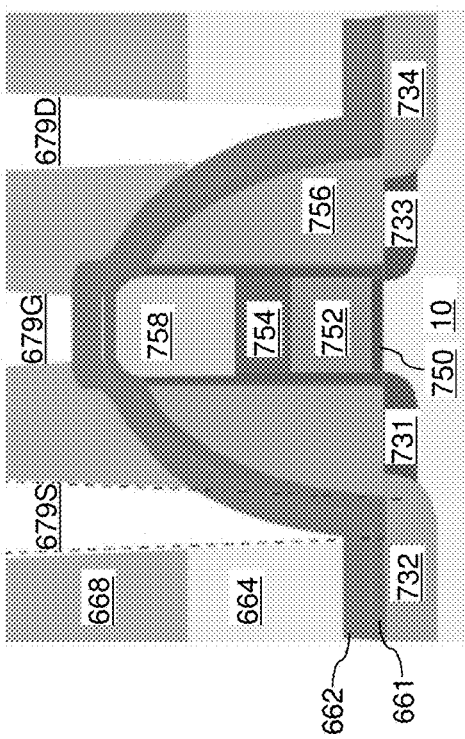
Figure 18C:
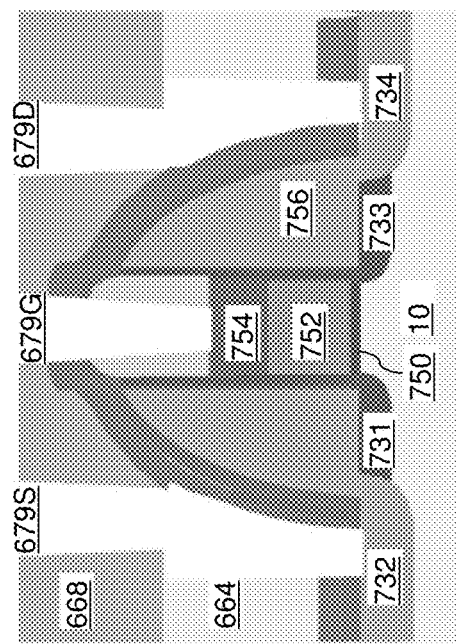

Referring to FIG. 18C, a second anisotropic etch process described above with respect to FIG. 8 is performed to etch unmasked portions of the at least one dielectric liner (661, 662) and the gate cap dielectric 758 selective to the materials of the deep active regions (732, 734) and selective to a material of the gate electrode (752, 754) and to expose the deep source and drain regions (732, 734) and the gate electrode (752, 754).

Referring to FIG. 18D, the contact via structures (686S, 686D, 686G) are formed in the respective contact via cavities (679S, 679D, 679G), using the deposition process described above with respect to FIGS. 9 and 10. Thus, in the fourth embodiment, the source and drain contact via structures (686S, 686D) contact the deep source and drain regions (732, 734) as shown by the dashed lines, even though the initial contact via structures formed at the step shown in FIG. 18A were misaligned with the contact regions of the deep source and drain regions (732, 734).

In alternative embodiments, a dielectric liner, such as a silicon nitride liner, may be formed on the sidewalls of the contact via cavities (679S, 679D, 679G) prior to forming the contact via structures (686S, 686D, 686G) in the respective contact via cavities. The dielectric liner may extend throughout the entire height of the contact via cavities or may extend only on a portion of the contact via cavities, such as the portions of the contact via cavities extending through the distal dielectric material layer 668.

The proximal dielectric layer 664 is shown in the above described figures as having a planar horizontal top surface in the second horizontal plane HP2. However, in alternative embodiments, the proximal dielectric layer 664 may be deposited conformally over the gate stack structure (750, 752, 754, 758, 755, 756). Thus, the top surface of the proximal dielectric layer 664 may be non-planar and may be located further from the semiconductor substrate 9 at locations above the gate stack structure (750, 752, 754, 758, 755, 756) than above the active regions {(731, 732), (733, 734)} and the shallow trench isolation structures 720.

Referring to all drawings and according to various embodiments of the present disclosure, a transistor is provided, which comprises: a semiconductor substrate 9 including a first active region (731, 732), a second active region (733, 734), and a semiconductor channel 735 of a first conductivity type located between the first active region (731, 732) and the second active region (733, 734), wherein the first active region (731, 732) and the second active region (733, 734) have a doping of a second conductivity type that is opposite of the first conductivity type; a gate stack structure (750, 752, 754, 758, 755, 756) that overlies the semiconductor channel and comprises a gate dielectric 750 and a gate electrode (752, 754); a proximal dielectric material layer 664 overlying the semiconductor substrate 9 and laterally surrounding the gate stack structure (750, 752, 754, 758, 755, 756); a distal dielectric material layer 668 overlying the proximal dielectric material layer 664; and a first contact via structure 686S vertically extending through the distal dielectric material layer 668 and the proximal dielectric material layer 664, contacting a top surface of the first active region (731, 732), and having an upper sidewall contacting the distal dielectric material layer 668, a lower sidewall contacting the proximal dielectric material layer 664, and a horizontal connecting surface that connects a bottom edge of the upper sidewall to a top edge of the lower sidewall.

In one embodiment, the horizontal connecting surface contacts an overlying dielectric surface. In one embodiment, the overlying dielectric surface comprises a portion of a bottom surface of the distal dielectric material layer 668. In one embodiment, the overlying dielectric surface comprises a bottom surface of an etch stop dielectric layer 666 that is located between the distal dielectric material layer 668 and the proximal dielectric material layer 664. In one embodiment, the horizontal connecting surface has an inner periphery and an outer periphery; and a lateral distance between the inner periphery and the outer periphery is uniform throughout the horizontal connecting surface.

In one embodiment, an entirety of the top surface of the proximal dielectric material layer 664 is located within a horizontal plane (such as the second horizontal plane HP2); and an entirety of the horizontal connecting surface of the first contact via structure 686S is located within the horizontal plane.

In one embodiment, the gate stack structure (750, 752, 754, 758, 755, 756) comprises: a gate cap dielectric that overlies the gate electrode (752, 754); and a dielectric gate spacer that laterally surrounds the gate electrode (752, 754) and the gate cap dielectric 758.

In one embodiment, the transistor comprises at least one dielectric liner (661, 662) overlying a top surface of the semiconductor substrate 9 and overlying the gate stack structure (750, 752, 754, 758, 755, 756). In one embodiment, an entirety of a contact area between the first contact via structure 686S and the at least one dielectric liner (661, 662) is located at, or below, a top surface of a horizontally-extending portion of the at least one dielectric liner (661, 662) that overlies the semiconductor substrate 9 and is laterally spaced from the gate stack structure (750, 752, 754, 758, 755, 756).

In one embodiment, a topmost edge of a contact area between the first contact via structure 686S and the at least one dielectric liner (661, 662) is located above a first horizontal plane HP1 including a top surface of a horizontally-extending portion of the at least one dielectric liner (661, 662) that overlies the semiconductor substrate 9 and is laterally spaced from the gate stack structure (750, 752, 754, 758, 755, 756), and is located below a second horizontal plane HP2 including the top surface of the proximal dielectric material layer 664.

In one embodiment, the first contact via structure 686S contacts the at least one dielectric liner (661, 662). In one embodiment, a first tapered or vertical portion of the dielectric liner that contacts a sidewall of the first contact via structure 686S has a lesser thickness than a second tapered or vertical portion of the dielectric liner located above a horizontal plane including the top surface of the proximal dielectric material layer 664 (such as the second horizontal plane HP2) as well less than a horizontally-extending portion of the dielectric liner that overlies the semiconductor substrate 9.

In one embodiment, a lateral extent of the first contact via structure 686S within a plane including the top surface of the proximal dielectric material layer 664 (such as the second horizontal plane HP2) is greater than a lateral extent of the first contact via structure 686S within a plane including a top surface of the distal dielectric material layer 668 (such as the third horizontal plane HP3).

In one embodiment, a top surface of the proximal dielectric material layer 664 is more proximal to the semiconductor substrate 9 than a top surface of the gate stack structure (750, 752, 754, 758, 755, 756) is to the semiconductor substrate 9.

In one embodiment, a lateral extent of the first contact via structure 686S below a top surface of the proximal dielectric material layer 664 is greater than a lateral extent of the first contact via structure 686S above bottom surface of the distal dielectric material 668, and the first contact via structure 686S has a step in its sidewalls at an interface between the proximal dielectric material layer and the distant dielectric material layer.

In one embodiment, the first contact via structure 686S comprises a first metallic nitride liner 682S that continuously extends from a horizontal plane including a top surface of the distal dielectric material layer 668 to a top surface of the first active region (731, 732); and a first metallic fill material portion 684S embedded in the first metallic nitride liner 682S and having a top surface within the horizontal plane including the top surface of the distal dielectric material layer 668.

In one embodiment, the first contact via structure 686S comprises a void 689S embedded within a region of the first metallic fill material portion 684S that underlies a horizontal plane including the top surface of the proximal dielectric material layer 664; and a vertically-extending seam 687S that extends from the void 689S to a horizontal plane including a top surface of the distal dielectric material layer 668.

The various embodiments of the present disclosure can be employed to form stepped contact via structures having a greater lateral extent at a level of a proximal dielectric material layer 664 than at a level of a distal dielectric material layer 668. The increased lateral extent of the stepped contact via structures can increase the contact are between the stepped contact via structures and the underlying active regions, and thus, can reduce the contact resistance and increase the on-current of a field effect transistor, without increasing the size and pitch of the top portions of the contact via structures. Alternatively, the size and pitch of the top portions of the contact via structures can be reduced to increase the device density without increasing the contact resistance to the active regions.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A transistor comprising:
a semiconductor substrate including a first active region, a second active region, and a semiconductor channel of a first conductivity type located between the first active region and the second active region, wherein the first active region and the second active region have a doping of a second conductivity type that is opposite of the first conductivity type;
a gate stack structure that overlies the semiconductor channel and comprises a gate dielectric and a gate electrode;
a proximal dielectric material layer overlying the semiconductor substrate and laterally surrounding the gate stack structure;
a distal dielectric material layer overlying the proximal dielectric material layer;
a first contact via structure vertically extending through the distal dielectric material layer and the proximal dielectric material layer, contacting a top surface of the first active region, and having an upper sidewall contacting the distal dielectric material layer, a lower sidewall contacting the proximal dielectric material layer, and a horizontal connecting surface that connects a bottom edge of the upper sidewall to a top edge of the lower sidewall; and
at least one dielectric liner overlying a top surface of the semiconductor substrate and overlying the gate stack structure;
wherein a topmost edge of a contact area between the first contact via structure and the at least one dielectric liner is located above a first horizontal plane including a top surface of a horizontally-extending portion of the at least one dielectric liner that overlies the semiconductor substrate and is laterally spaced from the gate stack structure, and is located below a second horizontal plane including the top surface of the proximal dielectric material layer.

2. A transistor comprising:
a semiconductor substrate including a first active region, a second active region, and a semiconductor channel of a first conductivity type located between the first active region and the second active region, wherein the first active region and the second active region have a doping of a second conductivity type that is opposite of the first conductivity type;
a gate stack structure that overlies the semiconductor channel and comprises a gate dielectric and a gate electrode;
a proximal dielectric material layer overlying the semiconductor substrate and laterally surrounding the gate stack structure;

a distal dielectric material layer overlying the proximal dielectric material layer;

a first contact via structure vertically extending through the distal dielectric material layer and the proximal dielectric material layer, contacting a top surface of the first active region, and having an upper sidewall contacting the distal dielectric material layer, a lower sidewall contacting the proximal dielectric material layer, and a horizontal connecting surface that connects a bottom edge of the upper sidewall to a top edge of the lower sidewall; and at least one dielectric liner overlying a top surface of the semiconductor substrate and overlying the gate stack structure;

wherein the first contact via structure contacts the at least one dielectric liner; and wherein a first tapered or vertical portion of the dielectric liner that contacts a sidewall of the first contact via structure is thinner than a second tapered or vertical portion of the dielectric liner located above a horizontal plane including the top surface of the proximal dielectric material layer, and is thinner than a horizontally-extending portion of the dielectric liner that overlies the semiconductor substrate.

* * * * *